United States Patent
Fujimoto et al.

(10) Patent No.: US 9,188,878 B2
(45) Date of Patent: Nov. 17, 2015

(54) DRIVING SYSTEM AND DRIVING METHOD, EXPOSURE APPARATUS AND EXPOSURE METHOD, AND DRIVING SYSTEM DESIGN METHOD

(75) Inventors: Hiroshi Fujimoto, Tokyo (JP); Kazuaki Saiki, Yokohama (JP); Koichi Sakata, Yokohama (JP)

(73) Assignees: THE UNIVERSITY OF TOKYO, Tokyo (JP); NIKON CORPORATION, Tokyo (JP)

( * ) Notice: Subject to any disclaimer, the term of this patent is extended or adjusted under 35 U.S.C. 154(b) by 109 days.

(21) Appl. No.: 13/981,733

(22) PCT Filed: Jan. 27, 2012

(86) PCT No.: PCT/JP2012/000548
§ 371 (c)(1),
(2), (4) Date: Oct. 8, 2013

(87) PCT Pub. No.: WO2012/102060
PCT Pub. Date: Aug. 2, 2012

(65) Prior Publication Data
US 2014/0028992 A1   Jan. 30, 2014

(30) Foreign Application Priority Data
Jan. 28, 2011   (JP) ................. 2011-017265

(51) Int. Cl.
G03F 7/20 (2006.01)
(52) U.S. Cl.
CPC ........ *G03F 7/70775* (2013.01); *G03F 7/70725* (2013.01); *G03F 7/70758* (2013.01)
(58) Field of Classification Search
CPC ............ G03F 7/70775; G03F 7/70758; G03F 7/70725

USPC ............... 355/53, 72, 75; 310/12.05, 12.06, 310/12.19; 356/500; 702/94, 150
See application file for complete search history.

(56) References Cited

U.S. PATENT DOCUMENTS

| | | | |
|---|---|---|---|
| 5,473,424 A | * | 12/1995 | Okumura ................. 356/139.03 |
| 5,729,331 A | | 3/1998 | Tanaka et al. |
| 6,611,316 B2 | | 8/2003 | Sewell |
| 6,744,511 B1 | * | 6/2004 | Saiki et al. .................... 356/399 |

(Continued)

FOREIGN PATENT DOCUMENTS

| JP | A-2002-7311 | 1/2002 |
|---|---|---|
| JP | A-2002-73111 | 3/2002 |
| JP | A-2006-203113 | 8/2006 |

OTHER PUBLICATIONS

International Search Report issued in International Application No. PCT/JP2012/000548 on Feb. 21, 2012 (with translation).
Written Opinion of the International Searching Authority issued in International Application No. PCT/JP2012/000548 on Feb. 21, 2012 (with translation).

(Continued)

*Primary Examiner* — Steven H Whitesell Gordon
(74) *Attorney, Agent, or Firm* — Oliff PLC

(57) ABSTRACT

At a carriage that shows a resonance mode in opposite phase to a resonance mode shown by a plate table where an interferometer which measures a position (a first controlled variable) of a plate stage driven according to a control input is installed, another interferometer is installed which measures a position (the second controlled variable) of the plate stage. By using the interferometer and the another interferometer, it becomes possible to design a driving system robust in a high bandwidth that drives the plate stage.

36 Claims, 24 Drawing Sheets

(56) References Cited

U.S. PATENT DOCUMENTS

| | | |
|---|---|---|
| 6,778,257 B2 | 8/2004 | Bleeker et al. |
| 2010/0157264 A1* | 6/2010 | Butler et al. .................... 355/53 |
| 2011/0193510 A1* | 8/2011 | Fleming ....................... 318/611 |

OTHER PUBLICATIONS

Jul. 2, 2015 Office Action issued in Chinese Application No. 201280006512.8.

\* cited by examiner

| $M_1$ | 5.3 kg |
|---|---|
| $M_2$ | 7.7 kg |
| $J_1$ | 0.015 kgm² |
| C | 24 N/(m·s) |
| k | 1700 Nm/rad |
| μ | 0.20 Nm/(rad/s) |
| L | 0.092 m |
| l | 0.085 m |
| $\tau_d$ | 6.0×10⁻⁴ s |

*Fig. 11A*
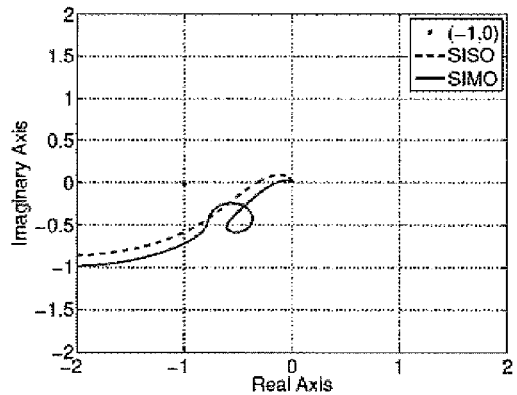
*Fig. 11B*
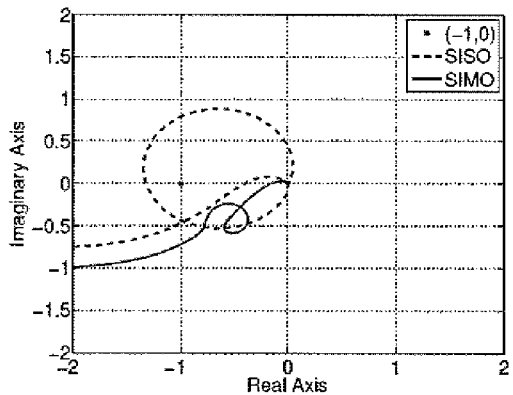
*Fig. 11C*
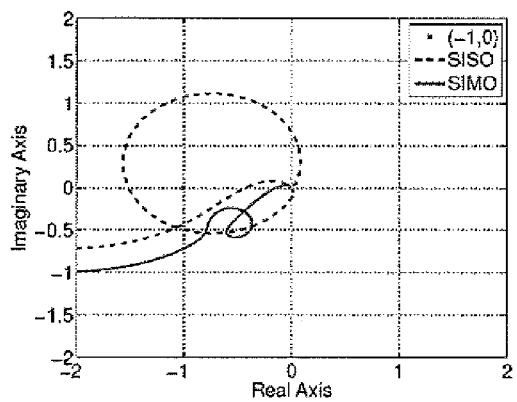
*Fig. 12*
|  | SISO | | SIMO | |
|---|---|---|---|---|
|  | $G_m[\text{dB}]$ | $P_m[\text{deg}]$ | $G_m[\text{dB}]$ | $P_m[\text{deg}]$ |
| (A) Nominal | 9.7 | 30.1 | 17.8 | 35.7 |
| (B) 0.5k | Unstable | Unstable | 17.8 | 35.7 |
| (C) $5J_1$ | Unstable | Unstable | 17.8 | 35.7 |

Fig. 18A
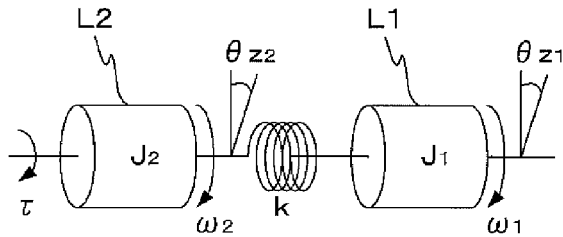
Fig. 18B
| J₁ | 0.01 kgm² |
|---|---|
| J₂ | 0.02 kgm² |
| k | 1000 Nm/rad |
Fig. 19A
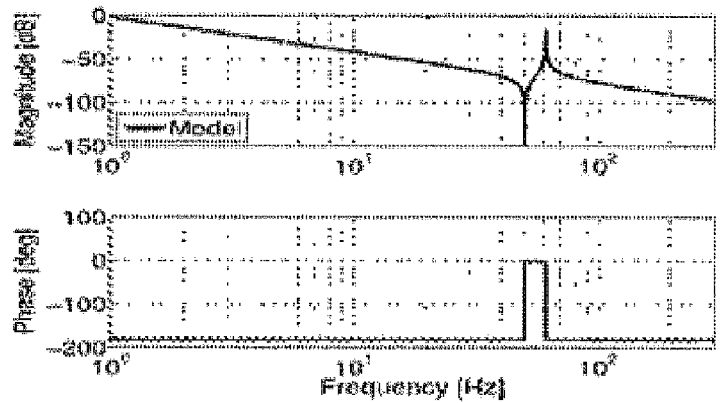
FREQUENCY RESPONSE CHARACTERISTIC OF $P_2(s)$
Fig. 19B
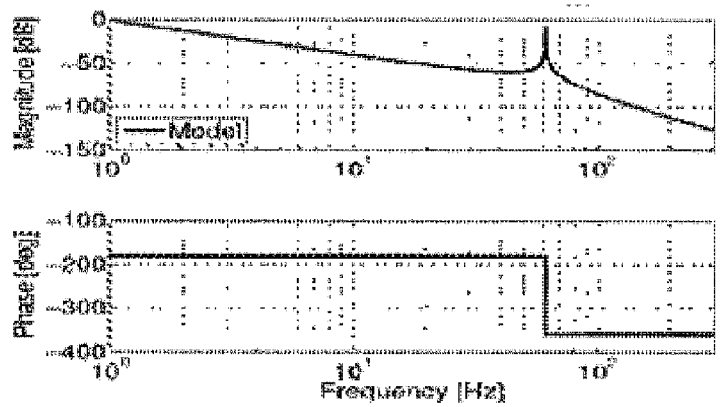
FREQUENCY RESPONSE CHARACTERISTIC OF $P_1(s)$

|  | SISO | | SIMO | |
|---|---|---|---|---|
|  | $G_m$[dB] | $P_m$[deg] | $G_m$[dB] | $P_m$[deg] |
| Nominal | 12.2 | 30.2 | Inf | 43.5 |

DRIVING SYSTEM AND DRIVING METHOD, EXPOSURE APPARATUS AND EXPOSURE METHOD, AND DRIVING SYSTEM DESIGN METHOD

TECHNICAL FIELD

The present invention relates to driving systems and driving methods, exposure apparatuses and exposure methods, and driving system design methods, and more particularly to a driving system and a driving method to drive a plant by providing a control input, an exposure apparatus equipped with the driving system and an exposure method using the driving method, and a driving system design method to design the driving system.

BACKGROUND ART

In a lithography process to manufacture electronic devices (microdevices) such as liquid crystal display devices, semiconductor devices and the like, a projection exposure apparatus of a step-and-repeat method (a so-called stepper), a projection exposure apparatus of a step-and-scan method (so-called scanning stepper (also called a scanner)) and the like are mainly used. As for an exposure apparatus for manufacturing liquid crystal display devices (a liquid crystal exposure apparatus), according to an increase in substrate size, a scanning type projection exposure apparatus such as a scanner has become mainstream.

Electronic devices (microdevices) are manufactured by overlaying and forming a pattern of a plurality of layers on a substrate (a glass plate, a wafer and the like). Therefore, in an exposure apparatus, it is necessary to accurately overlay and transfer a mask pattern onto a pattern which is already formed in each shot area on the substrate, that is, high overlay accuracy is required.

In order to achieve high overlay accuracy, a technique of precisely and stably driving a substrate stage which moves holding a substrate becomes necessary. Here, in recent years, as the substrate stage, a gantry stage is mainly employed which is equipped with a carriage which moves in a scanning direction of the substrate at the time of scanning exposure, and a substrate table which is supported on the carriage and moves in a non-scanning direction while holding the substrate. The gantry stage and the like generates resonance which may become an obstacle factor when driving the substrate stage stably with high precision. Especially recently, with the size of the substrate stage increasing, the resonance frequency (natural frequency) is becoming lower.

As a theoretical framework for structuring a robust control system with respect to high bandwidth including a resonance band of such a substrate stage and also to variation of resonance frequency using a notch filter, a stage controller is known which utilizes an advanced robust control theory represented by the H-infinity control theory (for example, refer to Patent Literature (PTL) 1). In the advanced robust control theory, while a sensor is added so as to make the plant a system of one input and multiple outputs, there are no restrictions to the placement of the added sensor, and further, a feedback controller can be designed which is also stable to a modeling error of a nominal model. However, in general, because degrees of freedom in designing a controller increases according to a structure of the plant, an order of a weight function and the like, a trade-off relation occurs between the high bandwidth and the robustness of the feedback controller.

CITATION LIST

Patent Literature

[PTL 1] Japanese Unexamined Patent Application Publication No. 2002-73111

DISCLOSURE OF INVENTION

Means for Solving the Problems

According to a first aspect of the present invention, there is provided a driving system which drives a plant by giving a control input, the system comprising: a first measuring instrument which measures a first controlled variable related to a position of a first measurement point provided at a first section of the plant, a second measuring instrument which measures a second controlled variable related to a position of a second measurement point provided at a second section of the plant, a controlling section which obtains the control input by performing a control operation based on measurement results of the first and the second measuring instruments and a desired value, and gives the control input to a control point provided at the plant, wherein the second section is in a relation in opposite phase with the first section, in a predetermined vibration state which appears when the control point to the first measurement point of the plant is a rigid body.

Here, controlled variable related to position (the first controlled variable and the second controlled variable) refers, as a matter of course, not only to the case when velocity which is obtained by differentiating position, acceleration and the like serve as the controlled variable, but also includes the case when position itself serves as the controlled variable. In the description, while the term physical quantity related to position is also used, physical quantity also in this case not only includes variables such as velocity which is obtained by differentiating position, acceleration and the like, but also includes position itself. As is described, in the description, as a general term for position or velocity which is obtained by differentiating position, acceleration and the like, the expression variable related to position (controlled variable or physical quantity) is used.

According to this system, it becomes possible to drive a plant precisely and in a stable manner.

According to a second aspect of the present invention, there is provided a first exposure apparatus that exposes an object with an energy beam and forms a pattern on the object, the apparatus comprising the driving system of the first aspect wherein the plant is a movable body that moves on a predetermined plane holding the object.

According to this apparatus, it becomes possible to drive a movable body holding an object precisely and in a stable manner, which makes exposure of an object possible with high precision.

According to a third aspect of the present invention, there is provided a second exposure apparatus that exposes an object via a mask with an energy beam, the apparatus comprising: the driving system of the first aspect wherein the plant is a movable body that moves holding the mask.

According to this apparatus, it becomes possible to drive a movable body holding a mask precisely and in a stable manner, which makes it possible to overlay and transfer a pattern of a mask onto an object with high precision.

According to a fourth aspect of the present invention, there is provided a driving method, comprising: measuring a first controlled variable related to a position of a first section of a plant; measuring a second controlled variable related to a position of a second section of the plant; and driving the plant by performing a control operation to obtain a control input based on measurement results of the first controlled variable and the second controlled variable and desired value, and by giving the control input to the plant, wherein the second section is in a relation in opposite phase with the first section, in a predetermined vibration state which appears when the control point to the first measurement point of the plant is a rigid body.

According to this method, it becomes possible to drive a plant precisely and in a stable manner.

According to a fifth aspect of the present invention, there is provided a first exposure method in which an object is exposed with an energy beam, and a pattern is formed on the object, the method comprising: driving a movable body that moves on a predetermined plane holding the object by the driving method of the fourth aspect as the plant.

According to this method, it becomes possible to drive a movable body holding an object precisely and in a stable manner, which makes exposure of an object possible with high precision.

According to a sixth aspect of the present invention, there is provided a second exposure method in which an object is exposed via a mask with an energy beam, the method comprising: driving a movable body that moves holding the mask by the driving method of the fourth aspect as the plant.

According to this method, it becomes possible to drive a movable body holding a mask precisely and in a stable manner, which makes it possible to overlay and transfer a pattern of a mask onto an object with high precision.

According to a seventh aspect of the present invention, there is provided a driving system design method in which a driving system for driving a plant is designed, the method comprising: installing a first measuring instrument and a second measuring instrument that measure a first controlled variable and a second controlled variable related to positions of a first section and a second section of the plant, respectively, at the first section and the second section of the plant where vibration modes with respect to a rigid-body mode become an opposite phase mutually.

According to this method, by using the first measuring instrument and the second measuring instrument, it becomes possible to design a driving system robust in a high bandwidth.

BRIEF DESCRIPTION OF DRAWINGS

FIGS. 11A to 11C are Nyquist diagrams for each of the feedback control systems in a one-input two-output system (SIMO system) and a one-input one-output system (SISO system), for each condition A to C.

FIG. 12 is a table showing gain margin (Gm) and phase margin (Pm) for conditions A to C.

FIG. 18A is a view showing a dynamic model of a typical two-inertial system, and FIG. 18B is a table showing dynamic parameters included in the dynamic model of FIG. 18A.

FIGS. 19A and 19B are Bode diagrams that respectively show a frequency response characteristic of a transfer function expressing an input-output response of a carriage of plate stage PST and a plate table in a feedback control system of a one-input two-output system related to a second embodiment.

BEST MODE FOR CARRYING OUT THE INVENTION

A First Embodiment

Hereinafter, a first embodiment will be described, based on FIGS. 1 to 17.

Figure 1:
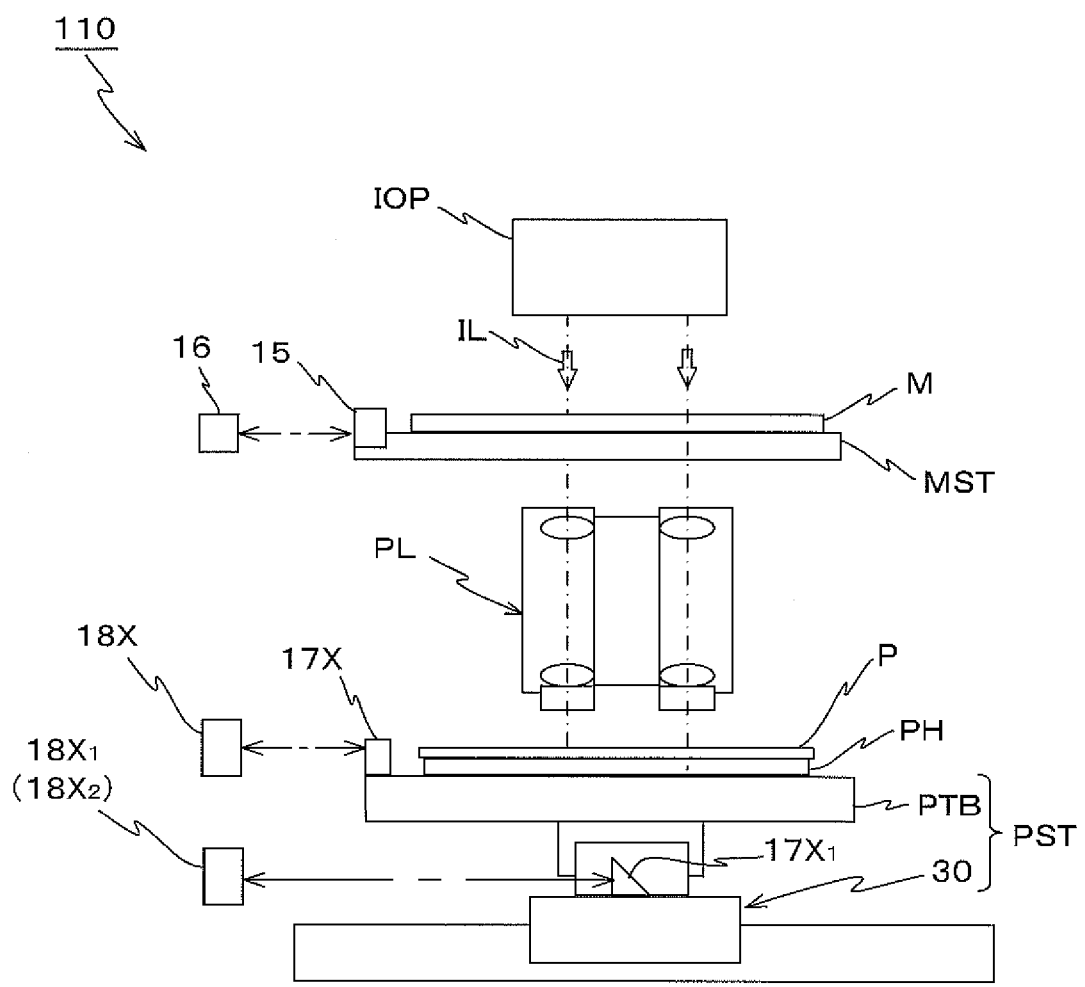
FIG. 1 is a view schematically showing a structure of an exposure apparatus related to a first embodiment.

FIG. 1 schematically shows a structure of an exposure apparatus 110 related to the first embodiment used for manufacturing flat panel displays, such as, for example, liquid crystal display devices (liquid crystal panels) and the like. Exposure apparatus 110 is a scanning stepper (scanner) which relatively scans a mask M on which a liquid crystal display device pattern is formed and a glass plate (hereinafter referred to as a "plate") P held by a plate stage PST, along a predetermined scanning direction (here, an X-axis direction which is a lateral direction within the page surface of FIG. 1) with respect to a projection optical system PL, for example, at the same velocity in the same direction, and transfers the pattern of mask M onto plate P. Exposure apparatus 110 is equipped with an illumination system IOP, a mask stage MST which holds mask M, projection optical system PL, a body not shown on which mask stage MST, projection optical system PL and the like are mounted, a plate stage PST which holds plate P via a plate holder PH, a control system for these parts, and the like. The control system is mainly structured by a main controller (not shown) which has overall control of each section structuring exposure apparatus 110, and a stage controller 50 (refer to FIG. 3 and the like) which operates under the control of the main controller. In the description below, a direction in which mask M and plate P are each relatively scanned with respect to projection optical system PL at the time of exposure will be described as the X-axis direction (X direction), a direction orthogonal to the X-axis direction within a horizontal plane will be described as a Y-axis direction (Y direction), a direction orthogonal to the X-axis and the Y-axis will be described as a Z-axis direction (Z direction, rotation (tilt) directions around the X-axis, the Y-axis, and the Z-axis will be described as a θx direction, a θy direction, and a θz direction, respectively.

Illumination system IOP is structured similarly to an illumination system as disclosed in, for example, U.S. Pat. No. 5,729,331 and the like. That is, illumination system IOP has a plurality of, for example, five illumination systems which illuminate each of a plurality of, for example, five illumination areas that are placed on mask M in a staggered manner, and each of the illumination systems irradiates light emitted from a light source (for example, mercury lamp) not shown on mask M as illumination light (illumination light) IL for exposure, via a reflection mirror, a dichroic mirror, a shutter, a wavelength selection filter, various kinds of lenses and the like which are not shown. As illumination light IL, for example, light such as an i-line (wavelength 365 nm), a g-line (wavelength 436 nm), or an h-line (wavelength 405 nm) (or a synthetic light of the i-line, the g-line, and the h-line described above) is used. Further, wavelength of illumination light IL can be switched appropriately by a wavelength selection filter, according to the resolution that is required.

To mask stage MST, mask M which has a circuit pattern and the like formed on its pattern surface (the lower surface in FIG. 1) is fixed, for example, by vacuum chucking (or electrostatic suction). Mask stage MST is supported in a non-contact state (supported by levitation) via a gas static bearing (for example, an air bearing) which is not shown, on a pair of mask stage guides (not shown) extending in the X-axis direction fixed to an upper surface of a barrel surface plate which is apart of the body not shown. Mask stage MST is driven in predetermined strokes in the scanning direction (the X-axis direction), and is also finely driven appropriately in each of the Y-axis direction and the θz direction, for example, by a mask stage driving system MSD which includes a linear motor (not shown in FIG. 1, refer to FIG. 3). Position information (including rotation information in the θz direction) of mask stage MST within an XY plane is measured by a mask interferometer system 16.

Mask interferometer system 16 irradiates a measurement beam on a movable mirror 15 fixed to an edge of mask stage MST, and by receiving a reflected light from movable mirror 15, measures a position of mask stage MST. The measurement results are supplied to stage controller 50 (refer to FIG. 3), and stage controller 50 drives mask stage MST via mask stage driving system MSD, based on the measurement results of mask interferometer system 16. Incidentally, instead of a movable mirror, mirror-polishing can be applied to an edge surface of the mask stage so as to form a reflection surface (corresponding to a reflection surface of the movable mirror). Further, instead of mask interferometer system 16, or along with mask interferometer system 16, an encoder (or an encoder system consisting of a plurality of encoders) can also be used.

Projection optical system PL is supported by a part of the body not shown (barrel surface plate), below mask stage MST in FIG. 1. Projection optical system PL is structured similarly to a projection optical system disclosed in, for example, U.S. Pat. No. 5,729,331. That is, projection optical system PL includes a plurality of, for example, five projection optical systems (multi-lens projection optical system) whose projection areas of a pattern image of mask M are placed in a staggered manner that correspond to the plurality of illumination areas previously described, and functions equally to a projection optical system that has a rectangular shaped single image field whose longitudinal direction is in the Y-axis direction. Here, three projection optical systems are placed at a predetermined spacing in the Y-axis direction, and the remaining two projection optical systems are set apart from the three projection optical system to the +X side, placed at a predetermined spacing in the Y-axis direction. In the present embodiment, as each of the plurality of (five) projection optical systems, for example, an equal magnifying system which is telecentric on both sides and forms an upright image is used. Further, hereinafter, the plurality of projection areas that are placed in a staggered manner of projection optical system PL will be referred to collectively as an exposure area.

When the illumination area on mask M is illuminated by illumination light IL from illumination system IOP, by illumination light IL having passed through mask M which is placed so that its pattern surface almost coincides a first plane (an object plane) of projection optical system PL, a projection image (a partially erected image) of the circuit pattern of mask M within the illumination area is formed on an irradiation area (exposure area) of illumination light IL which is conjugate to an illumination area on plate P whose surface is coated with a resist (sensitive agent) that is placed on a second plane (an image plane) side of projection optical system PL, via projection optical system PL. Then, by synchronously driving mask stage MST and plate stage PST (or to be more precise, a plate table PTB to be described later on), mask M is relatively moved in the scanning direction (the X-axis direction) with respect to the illumination area (illumination light IL) while plate P is relatively moved in the scanning direction (the X-axis direction) with respect to the exposure area (illumination light IL), and scanning exposure of one shot area (divided area) on plate P is performed, transferring the pattern of mask M onto the shot area. That is, in the present embodiment, the pattern of mask M is generated on plate P by illumination system TOP and projection optical system PL, and the pattern is formed on plate P by exposing a sensitive layer (resist layer) on plate P with illumination light IL.

Plate stage PST is placed below projection optical system PL (on the −Z side). Plate stage PST is equipped with a carriage 30 which moves in the X-axis direction (scanning direction), and plate table PTB which is supported on carriage 30 holding plate P and moves in the Y-axis direction (non-scanning direction, cross-scanning direction).

Figure 2:
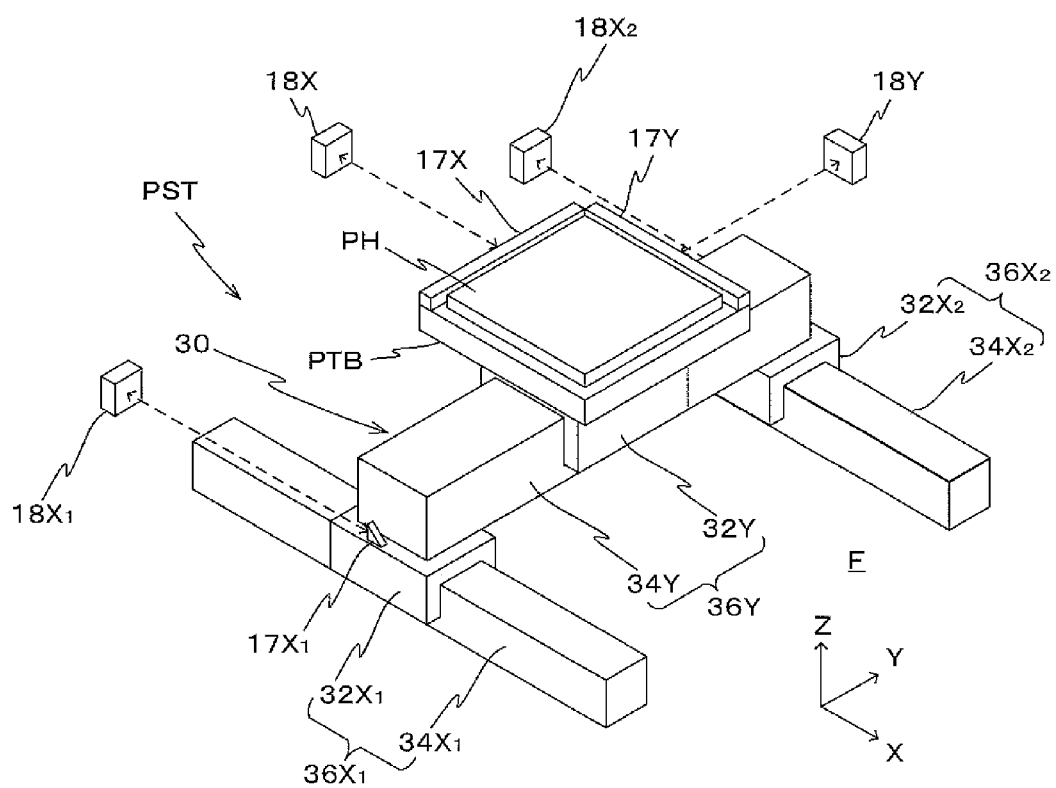
FIG. 2 is a perspective view showing a plate stage.

FIG. 2 shows plate stage PST, along with a plate interferometer system 18 (18X, 18Y, $18X_1$, $18X_2$, refer to FIG. 3) in a perspective view. Plate table PTB, as shown in FIG. 2, consists of a member which has a rectangular plate shape in a planar view, and in the center of its upper surface, plate holder PH which holds plate P (not shown in FIG. 2, refer to FIG. 1) by suction is fixed. Plate table PTB is supported on a Y slider 32Y, via a plurality of, for example, three support mechanisms (not shown). Each support mechanism supports plate table PTB, and also includes an actuator (e.g., a voice coil motor and the like) for driving plate table PTB in the Z-axis direction at the supporting point. By the three support mechanisms, plate table PTB is finely driven in directions of three degrees of freedom (in each of the Z-axis, the θx, and the θy directions) on Y slider 32Y.

Y slider 32Y is a member whose XZ section is in an inverse U-shape, and engages from above with a Y beam (Y guide) 34Y extending in the Y-axis direction in a non-contact manner, via an air bearing (not shown) and the like. Inside Y beam 34Y, for example, a plurality of coils are placed in the Y-axis direction at a predetermined spacing, and on an inner surface side of Y slider 32Y, for example, a plurality of permanent magnets are placed. By Y beam 34Y and Y slider 32Y, a moving-magnet-type Y linear motor 36Y is structured which drives Y slider 32Y serving as a mover in the Y-axis direction. By Y linear motor 36Y, plate table PTB is driven along Y beam 34Y in the Y-axis direction. Incidentally, as Y linear motor 36Y, the linear motor is not limited to a moving-magnet-type, and a moving-coil-type linear motor can also be used.

On a lower surface at one end and the other end in the longitudinal direction of Y beam 34Y, X sliders $32X_1$ and $32X_2$ are fixed. X sliders $32X_1$ and $32X_2$ are each a member whose YZ section is an inverse U-shape, placed apart in the Y-axis direction, and engaging from above with a pair of X guides $34X_1$ and $34X_2$ that each extend in the X-axis direction in a non-contact manner, via an air bearing (not shown) and the like. X guides $34X_1$ and $34X_2$ are each installed, via a vibration isolation member (or directly) on a floor surface F.

Inside each of the X guides $34X_1$ and $34X_2$, for example, a plurality of coils are placed in the X-axis direction at a predetermined spacing, and on an inner surface of each of the X sliders $32X_1$ and $32X_2$, a plurality of permanent magnets are placed. By X guide $34X_1$ and X slider $32X_1$, a moving-magnet-type X linear motor $36X_1$ is structured which drives X slider $32X_1$ serving as a mover in the X-axis direction. Similarly, by X guide $34X_2$ and X slider $32X_2$, a moving-magnet-type X linear motor $36X_2$ is structured which drives X slider $32X_2$ serving as a mover in the X-axis direction.

Here, carriage 30 (refer to FIG. 1) is structured including the pair of X sliders $32X_1$ and $32X_2$ and Y beam 34Y, and carriage 30 is driven in the X-axis direction by the pair of X linear motors $36X_1$, $36X_2$. Further, by the pair of X linear motors $36X_1$, $36X_2$ generating thrust (driving force) of different magnitudes, carriage 30 is driven in the θz direction by the pair of X linear motors $36X_1$, $36X_2$. Incidentally, as X linear motors $36X_1$, $36X_2$, the linear motor is not limited to a moving-magnet-type, and a moving-coil-type linear motor can also be used.

In the present embodiment, by Y linear motor 36Y, the pair of X linear motors $36X_1$, $36X_2$, and the three support mechanism (not shown) described above, a plate stage driving system PSD (refer to FIG. 3) is structured which drives plate table PTB in directions of six degrees of freedom (each direction in the X-axis, the Y-axis, the Z-axis, the θx, the θy, and the θz). Stage controller 50 has control over (each section structuring) plate stage driving system PSD (refer to FIG. 3).

Referring back to FIG. 2, on the upper surface of plate table PTB at the −X end and the +Y end, a movable mirror (flat mirror) 17X having a reflection surface orthogonal to the X-axis and a movable mirror (flat mirror) 17Y having a reflection surface orthogonal to the Y-axis are fixed, respectively. Further, a corner cube $17X_1$ is fixed on the upper surface of X slider $32X_1$, and a corner cube (not shown) is fixed on the upper surface of X slider $32X_2$, respectively.

Figure 3:
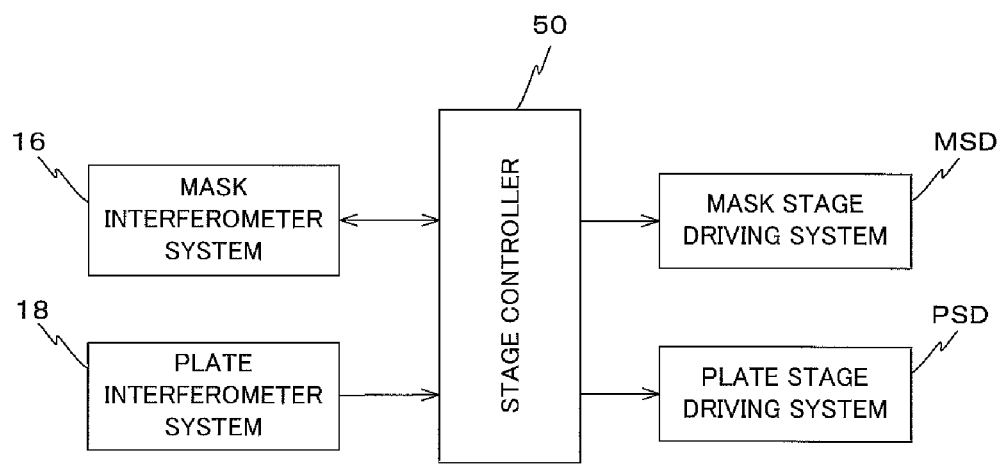
FIG. 3 is a block diagram showing a structure related to stage control of an exposure apparatus.

A position of plate stage PST is measured by plate interferometer system 18 (refer to FIG. 3). Plate interferometer system 18 includes the four interferometers 18X, 18Y, $18X_1$, and $18X_2$, as shown in FIG. 2.

Interferometer 18X irradiates at least three measurement beams parallel to the X-axis on movable mirror 17X fixed to plate table PTB, receives each of the reflected lights, and measures the position of plate table PTB in the X-axis direction, the θz direction, and the θy direction. Interferometer 18Y irradiates at least two measurement beams parallel to the Y-axis on movable mirror 17Y fixed to plate table PTB, receives each of the reflected lights, and measures the position of plate table PTB in the Y-axis direction and in the θx direction.

Interferometer $18X_1$ irradiates a measurement beam parallel to the X-axis on corner cube $17X_1$ fixed on X slider $32X_1$, receives the reflected light, and measures the position in the X-axis direction (X position) of carriage 30. Similarly, interferometer $18X_2$ irradiates a measurement beam parallel to the X-axis on the corner cube (not shown) fixed on X slider $32X_2$, receives the reflected light, and measures the position in the X-axis direction (X position) of carriage 30.

Measurement results of each interferometer of plate interferometer system 18 are supplied to stage controller 50 (refer to FIG. 3). Stage controller 50 drives plate stage PST (plate table PTB) within the XY plane via plate stage driving system PSD (to be more precise, the pair of X linear motors $36X_1$, $36X_2$, and Y linear motor 36Y), based on the measurement results of each interferometer of plate interferometer system 18. In the present embodiment, as it will be described later on, measurement results of interferometer 18X, and measurement results of at least either interferometer $18X_1$ or $18X_2$ are used, when driving plate stage PST (plate table PTB) in the X-axis direction.

Incidentally, stage controller 50 finely drives plate table PTB at least in one of the Z-axis direction, the θy direction, and the θz direction at the time of exposure and the like, based on detection results of a focus detection system which is not shown, via plate stage driving system PSD (to be more precise, the three support mechanisms (not shown)).

FIG. 3 shows a structure of a control system related to stage control of exposure apparatus 110. The control system in FIG. 3, for example, is structured mainly of stage controller 50 which includes a microcomputer and the like.

In exposure apparatus 110, a plurality of shot areas of plate P is exposed in the following procedure, based on results of an alignment measurement of the plate performed in advance (for example, EGA and the like). That is, according to instructions from the main controller (not shown), stage controller 50 moves mask stage MST and plate stage PST to their scanning starting positions (acceleration starting positions) for exposing one shot area on plate 2, while monitoring the measurement results of mask interferometer system 16 and plate interferometer system 18. Then, stage controller 50 synchronously drives stages MST and PST in the same direction, along the X-axis direction. Accordingly, the pattern of mask M is transferred onto one shot area on plate P, as previously described. During the scanning exposure, stage controller 50 finely adjusts the synchronous drive (relative position and relative velocity) of mask stage MST and plate stage PST, for example, according to a correction parameter. By this operation, the projection image of the pattern of mask M is aligned so as to overlay the pattern formed on a pre-processing layer.

When scanning exposure to one shot area is completed, stage controller 50 moves (steps) plate stage PST to a scanning starting position (acceleration starting position) for exposing the next shot area. Then, scanning exposure to the next shot area is performed. In the manner described so far, by repeating the stepping between shot areas of plate P and the scanning exposure to the shot area, the pattern of mask M is transferred onto all of the shot areas on plate P.

Next, a design of a driving system for driving plate stage PST (a control system for controlling the drive of plate stage PST) will be described.

In the present embodiment, a driving system which drives plate stage PST in a translation direction, as an example, in the X-axis direction, is described. Further, for comparison, conventional art will also be briefly described.

In the conventional art, a feedback control system (a closed loop control system) is structured employing a one-input one-output system (SISO system). A case will be considered when a feedback control system of this one-input one-output system (SISO system) is applied to exposure apparatus 110. In this case, interferometer 18X measures an X position (controlled variable) of plate stage PST (plate table PTB) which serves as a plant. Measurement result X is supplied to stage controller 50. Stage controller 50 obtains a control input U (a driving force F that X linear motors $36X_1$, $36X_2$ generate, or an electric current quantity I which is to be supplied to coils of X linear motors $36X_1$, $36X_2$, and the like) using measurement result X, and sends control input U which has been obtained to plate stage driving system PSD. Plate stage driving system PSD, according to control input U which has been received, for example, generates a driving force equivalent to driving force F, or supplies an electric current equivalent to electric current quantity I to the coils of X linear motors $36X_1$, $36X_2$. This drives (controls) plate stage PST.

Figure 4:
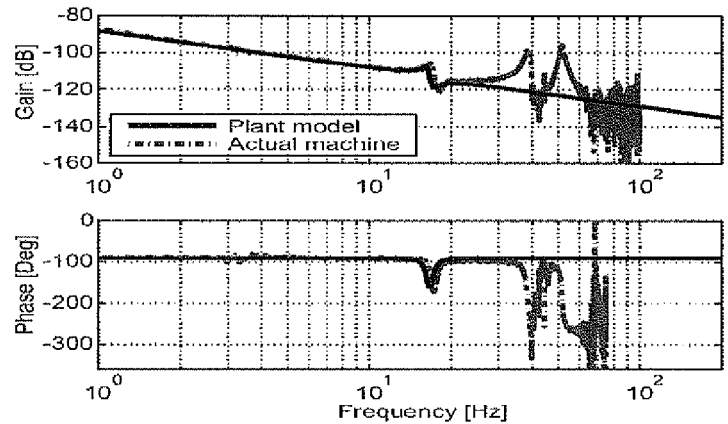
FIG. 4 is a Bode diagram showing a frequency response characteristic of a transfer function (magnitude and phase) which expresses an input-output response of a plate stage of a feedback control system in a one-input one-output system.

FIG. 4 shows a Bode diagram (magnitude (gain) |P(s)| and a phase arg(P(s))) that show a frequency response characteristic of a transfer function P (=X/U) which expresses an input-output response (response of controlled variable X with respect to control input U) of plate stage PST (plate table PTB) in the feedback control system of the one-input one-output system (SISO system) described above, that is, shows a gain diagram (view on the upper side) and a phase diagram (view on the lower side). Here, $s=j\omega=j2\pi f$, $j=\sqrt{(-1)}$, and f indicates frequency. In the drawing, for example, the solid line shows theoretical results which are obtained based on a dynamic model to be described later on, and the dashed line shows experimental results (results measured using an experimental unit). In the experiment, controlled variable X is measured with respect to control input U, and by applying the results to a definitional equation (P=X/U), the frequency response characteristic of transfer function P is obtained.

In the frequency response characteristic of transfer function P, it can be seen that a resonance mode (resonance behavior) appears around ten-odd Hz. Transfer function P, as a basic behavior, monotonously decreases its magnitude with respect to an increase in frequency f, so that the phase is constantly maintained. These are shown, in the gain diagram and the phase diagram, by a straight line with a downward slope and a straight line with a zero slope, respectively. And, transfer function P, as a resonance behavior, sharply increases and then decreases its magnitude and sharply decreases and then increases its phase, in around ten-odd Hz. These are shown, in the gain diagram and the phase diagram, by a successive peak and trough and a trough, respectively. That is, transfer function P, shows a resonance mode in opposite phase with respect to a rigid-body mode, in around ten-odd Hz.

The resonance mode (resonance behavior) described above appears in lower frequency bands due to larger exposure apparatuses in recent years, and has become a large setback for precise and stable control when driving plate stage PST. Incidentally, in the experimental result of the frequency response characteristic in FIG. 4, although sharp vibration behavior can be seen in the high frequency band (more than several tens of Hz), this will not be an issue here in particular.

In order to cancel out the resonance mode (resonance behavior) described above to precisely and stably control the drive of plate stage PST, a feedback control system of a one-input two-output system (SIMO system) is formed by using interferometer $18X_1$ (a second measuring instrument) in addition to interferometer 18X (a first measuring instrument) of plate interferometer system 18. Here, while the X position of carriage 30 can be measured either by interferometer $18X_1$ or interferometer $18X_2$, or can also be obtained by averaging the measurement values of both interferometers, in this case, for the sake of convenience, interferometer $18X_1$ is to be used as the second measuring instrument for measuring the X position of carriage 30.

In the feedback control system of this one-input two-output system (SIMO system), interferometers 18X, $18X_1$, measure X positions (controlled quantities) $X_1$, $X_2$ of plate table PTB (a first section of the plant) and carriage 30 (a second section of the plant) that structure plate stage PST (plant), respectively. These measurement results ($X_1$, $X_2$) are supplied to stage controller 50. Stage controller 50 obtains control input U (driving force F) using measurement results ($X_1$, $X_2$), and sends control input U which has been obtained to plate stage driving system PSD. Plate stage driving system PSD (X linear motors 36$X_1$, 36$X_2$) applies a driving force equal to driving force F to carriage 30 (the second section), according to control input U (driving force F) which has been received. This drives plate stage PST.

Figure 5A:
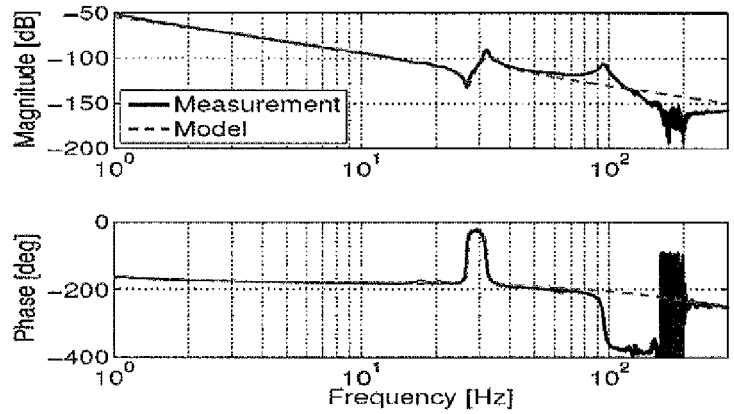
FIGS. 5A and 5B are Bode diagrams, respectively showing a frequency response characteristic of a transfer function which expresses an input-output response of a carriage of a plate stage and a plate table in a feedback control system in a one-input two-output system related to the first embodiment.
Figure 5B:
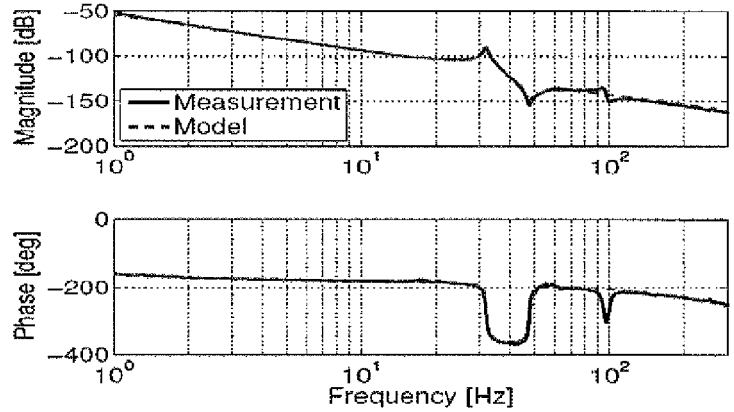

FIG. 5A shows a Bode diagram that shows a frequency response characteristic of a transfer function $P_2$ ($=X_2/U$) which expresses an input-output response (controlled variable $X_2$ with respect to control input U (driving force F)) of carriage 30, that is, shows a gain diagram (view on the upper side) and a phase diagram (view on the lower side). Further, FIG. 5B shows a Bode diagram that shows a frequency response characteristic of a transfer function $P_1$ ($=X_1/U$) which expresses an input-output response (controlled variable $X_1$ with respect to control input U (driving force F)) of plate table PTB, that is, shows a gain diagram (view on the upper side) and a phase diagram (view on the lower side).

The frequency response characteristic of transfer function $P_1$ to plate table PTB (FIG. 5B) shows a similar behavior as the frequency response characteristic previously described (FIG. 4). However, the frequency band in which the resonance behavior (resonance mode) appears shifts slightly to the higher frequency side. On the contrary, the frequency response characteristic of transfer function $P_2$ with respect to carriage 30 shows a behavior opposing the frequency response characteristic of transfer function $P_1$ (resonance mode in opposite phase), that is, shows a resonance mode in phase with the rigid-body mode. Transfer function $P_2$ sharply decreases and then increases its magnitude to the increase of frequency f, and sharply increases and then decreases its phase. These are shown, in the gain diagram and the phase diagram in FIG. 5A, by a successive trough and peak, and a peak, respectively.

Further, details of an exposure apparatus that uses feedback control to a plant of a one-input two-output system (SIMO system) is disclosed in, Japanese Unexamined Patent Application Publication No. 2006-203113. However, the apparatus was not sufficient enough because the two outputs are synthesized as one output, and the apparatus employs a structure of designing one controller with respect to the plant of the one-input one-output system (SISO system).

In exposure apparatus 110 related to the first embodiment, on building a feedback control system of a one-input two-output system (SIMO system), the second measuring instrument (interferometer 18$X_1$ (corner cube 17$X_1$)) is installed at the second section (carriage 30 (X slider 32$X_1$)) of plate stage PST which shows a resonance mode in opposite phase with respect to a resonance mode shown at the first section (plate table PTB) of plate stage PST where the first measuring instrument (interferometer 18X (movable mirror 17X)) is installed. This allows the desired feedback control system to be structured.

Figure 6:
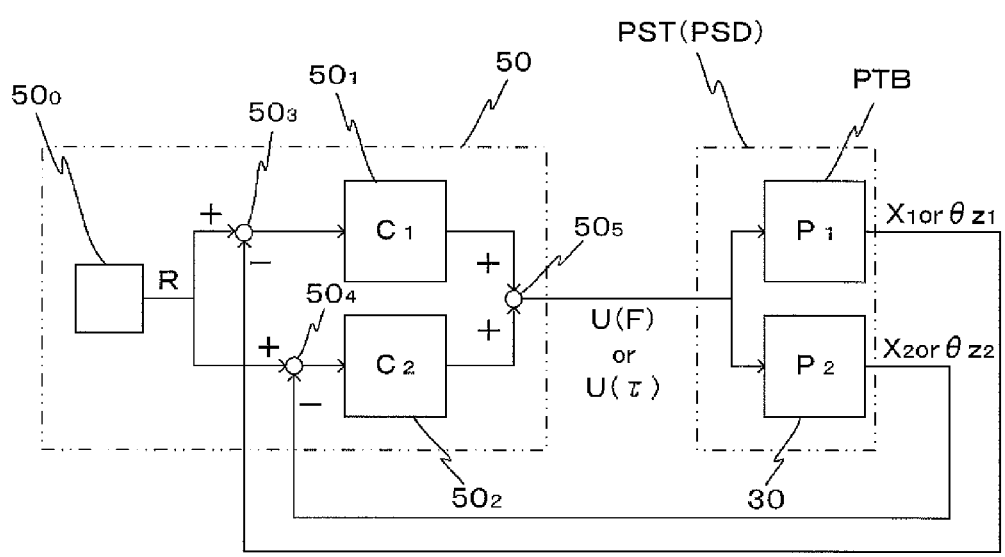
FIG. 6 is a block diagram expressing a feedback control system of a one-input two-output system related to the first embodiment.

FIG. 6 shows a block diagram which shows a closed loop control system (feedback control system) of a one-input two-output system (SIMO system) corresponding to the driving system which drives plate stage PST. The driving system corresponding to this closed loop control system in FIG. 6, includes interferometers 18X, 18$X_1$, of plate interferometer system 18 that measure an X position (a first controlled variable $X_1$) of the first section (plate table PTB) of plate stage PST serving as the plant and an X position (a second controlled variable $X_2$) of the second section (carriage 30), respectively, and stage controller 50 which drives plate stage PST. Stage controller 50 controls the position of plate stage PST by calculating control input U, based on a desired value R and measurement results of the first controlled variable and the second controlled variable ($X_1$, $X_2$), sending the results to plate stage driving system PSD, and driving plate stage PST. As is described, in the present embodiment, although drive of plate stage PST by stage controller 50 also involves position control of plate stage PST, in the description below, this will simply be referred to as drive (however, it will also be expressed as drive (position control) when necessary).

Here, while desired value (target trajectory), controlled variable, control input and the like are defined as a function of time, in FIG. 6 and the description using the drawing, the descriptions will be made using the Laplace transform of these functions according to the practice in the case of explaining a control block diagram. Further, as for operational expression U(R−$X_1$, R−$X_2$) to be described later on, the definition is to be given in the form of a Laplace transform. Further, in the description below, unless it is noted in particular, the description will be made using the Laplace transform (in the form of a Laplace transform).

Stage controller 50 includes a target generating section 50$_0$, two controllers 50$_1$ and 50$_2$, and two subtracters 50$_3$, 50$_4$, and an adder 50$_5$. Incidentally, while each of these sections are actually realized by a microcomputer and a software that structure stage controller 50, they can naturally be structured by a hardware.

Target generating section 50$_0$ generates a desired value of plate stage PST, in this case, a target position (a desired value of a position which changes moment by moment) R, and supplies the target position to subtracters 50$_3$, 50$_4$.

One of the subtracters 50$_3$ calculates a difference between target position R and X position $X_1$ (current position) of plate table PTB (transfer function $P_1$) measured by interferometer 18X, that is, calculates a deviation (R−$X_1$), and supplies the deviation to controller 50$_1$ (transfer function $C_1$). The other subtracter 50$_4$ calculates a difference between target position R and X position $X_2$ (current position) of carriage 30 (transfer function $P_2$) measured by interferometer 18$X_1$, that is, calculates a deviation (R−$X_2$) and supplies the deviation to controller 50$_2$ (transfer function $C_2$). Here, while X positions $X_1$, $X_2$ are measured by interferometers 18X, 18$X_1$, respectively, in FIG. 6, the interferometers are omitted in the drawing. Also in the block diagrams of the closed loop control system hereinafter, measuring instruments are similarly omitted in the drawings.

Controller 50$_1$ calculates an intermediate variable $C_1$(R−$X_1$) by calculation (control operation) so that deviation (R−$X_1$) becomes zero, and sends the quantity to adder 50$_5$. Similarly, controller 50$_2$ calculates an intermediate variable $C_2$(R−$X_2$) by control operation so that deviation (R−$X_2$) becomes zero, and sends the quantity to adder 50$_5$. Here, $C_1$, $C_2$ are a transfer function of controllers 50$_1$ and 50$_2$, respectively. Transfer function is a ratio R(s)/C(s) of the Laplace transform of input signal r(t) and output signal C(t), that is, a Laplace transform function of an impulse response function.

Adder 50$_5$ adds the output (intermediate variable) of controllers 50$_1$ and 50$_2$ and obtains control input U. As is described, stage controller 50 obtains control input U by performing control operation expressed by operational expression U(R−$X_1$, R−$X_2$)=$C_1$(R−$X_1$)+$C_2$(R−$X_2$), based on measurement results ($X_1$, $X_2$) of interferometers 18X, 18$X_1$, and target position R, and gives control input U to plate stage PST serving as the plant. This allows drive (position control) of plate stage PST, according to control input U.

Figures 7A, 7B:
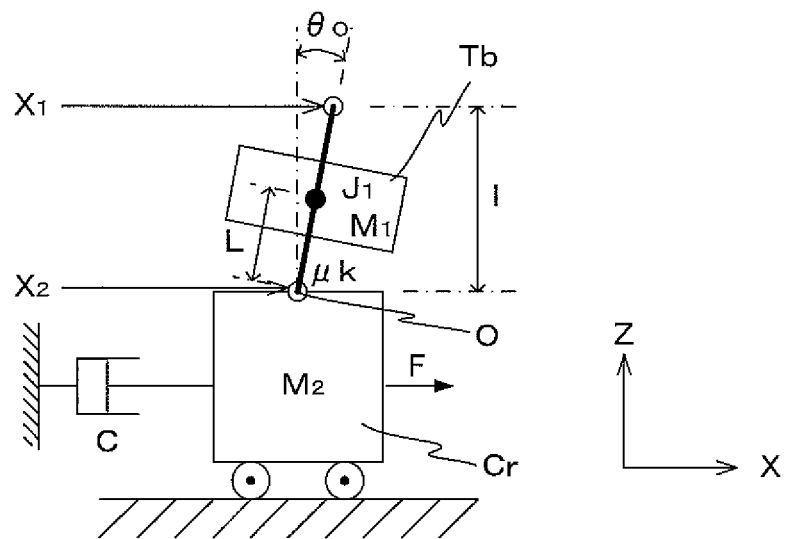
FIG. 7A is a view showing an example of a dynamic model that expresses a dynamic movement (translation motion) of a plate stage.
FIG. 7B is a table showing dynamic parameters included in the dynamic model of FIG. 7A.

In the present embodiment, to design controllers 50$_1$ and 50$_2$, that is to decide transfer functions $C_1$, $C_2$, dynamic movement of plate stage PST is expressed using a simplified dynamic model (rigid model). Here, as shown in FIG. 7A, plate stage PST is to be structured from two parts which are plate table PTB on which the first measuring instrument (interferometer 18X) is installed, and carriage 30 on which the second measuring instrument (interferometer $18X_1$) is installed. And, motion in the X-axis direction of these parts is to be expressed as motion of the two rigid bodies connected by a spring, or to be more specific, as shown in FIG. 7A, expressed as motion between a rigid body Cr (corresponding to carriage 30) which translates in the X-axis direction by driving force F that is given from a driving system corresponding to plate stage driving system PSD (X linear motors $36X_1$, $36X_2$) and a rigid body Tb (corresponding to plate table PTB) which is connected via a spring to a rotation center O on rigid body Cr that rotates (in a $\theta_O$ direction) around rotation center O.

Here, X positions of rigid bodies Tb and Cr are to be expressed as $X_1$, $X_2$, respectively, mass are to be expressed as $M_1$ and $M_2$, respectively, moment of inertia of rigid body Tb (regarding rotation center O) is to be expressed as viscosity (resistance proportional to velocity of rigid body Cr) is to be expressed as C, attenuation coefficient between rigid body Tb and rigid body Cr is to be expressed as μ, spring constant (torsional rigidity between rigid body Tb and rigid body Cr) is to be expressed as k, distance between the center of gravity of rigid body Tb and rotation center O is to be expressed as L, separating distance in the Z-axis direction of reference positions of each X position ($X_1$, $X_2$) measurement of rigid bodies Tb and Cr is to be expressed as l, and dead-time is to be expressed as τd. Incidentally, the table in FIG. 73 shows values of these dynamic parameters. These values are decided using a least-squares method and the like so that model formulas expressed by formula (1a) and formula (1b) to be described later on reproduce the (experimental results of the) frequency response characteristics shown in FIG. 5A and FIG. 5B, respectively.

In the rigid model described above, transfer functions $P_1$, $P_2$ that express input-output response (response of controlled quantities $X_1$, $X_2$ with respect to driving force F) of rigid bodies Tb and Cr can be given as follows, in the form of a Laplace transform.

$$P_1(s) = \frac{X_1}{F} = \frac{b_{12}s^2 + b_{11}s + b_{10}}{a_4s^4 + a_3s^3 + a_2s^2 + a_1s}e^{-\tau_d s}$$ (1a)

$$P_2(s) = \frac{X_2}{F} = \frac{b_{22}s^2 + b_{21}s + b_{20}}{a_4s^4 + a_3s^3 + a_2s^2 + a_1s}e^{-\tau_d s}$$ (1b)

$a_4 = M_1M_2L^2 + (M_1+M_2)J_1$,
$a_3 = (M_1+M_2)\mu + (M_1L^2+J_1)C$,
$a_2 = (M_1+M_2)k - (M_1+M_2)M_1gL + \mu C$,
$a_1 = (k - M_1gL)C$,
$b_{12} = M_1L^2 + J_1 - M_1Ll$,
$b_{22} = M_1L^2 + J_1$,
$b_{11} = b_{21} = \mu$,
$b_{20} = b_{10} = k - M_1gL$.

However,

Transfer functions $C_1$, $C_2$ are decided, using transfer functions $P_1$, $P_2$ described above. For the sake of convenience, transfer functions $P_1$, $P_2$, $C_1$, and $C_2$ will be expressed in the form of a fractional expression $P_1 = N_{P1}/D_PD_R$, $P_2 = N_{P2}/D_PD_R$, $C_1 = N_{C1}/D_C$, and $C_2 = N_{C2}/D_C$. Here, $N_{P1} = b_{12}s^2 + b_{11}s + b_{10}$ (2a)

$N_{P2} = b_{22}s^2 + b_{21}s + b_{20}$ (2b)

$D_P = s^2 + C/(M_1+M_2)s$ (2c)

$D_R = a_4s^2 + (a_3 - a_4C/(M_1+M_2))s + a_1(M_1+M_2)/C$ (2d).

In this case, characteristic equation $A_{CL}$ of a closed loop transfer function with respect to a feedback control system (FIG. 6) is given, by a numerator of fractional expression $1+C_1P_1+C_2P_2$. That is, $A_{CL} = D_CD_PD_R + N_{C1}N_{P1} + N_{C2}N_{P2}$ (3)

In characteristic equation $A_{CL}$, $N_{C1}$ and $N_{C2}$ are decided so that the following formula (4) is satisfied, using an arbitrary analytical function α.

$N_{C1}N_{P1} + N_{C2}N_{P2} = \alpha D_R$ (4)

From this, an open loop transfer function $C_1P_1 + C_2P_2 = \alpha/D_CD_P$ is obtained, and an extreme zero offset is performed of poles that give resonance behavior included in each of $P_1$, $P_2$ (that is, resonance mode that $P_1$, $P_2$ respectively show). Furthermore, $D_C$, α are decided so that characteristic equation $A_{CL}$ has a stable pole (in this description, becomes a multiple root for the sake of convenience), that is, so that the following formula (5) is satisfied.

$A_{CL} = (D_CD_P + \alpha)D_R = (s + \omega_n)^n D_R$ (5)

Next, a specific form of transfer functions $C_1$, $C_2$ ($N_{C1}$, $N_{C2}$, $D_C$, α) is decided. $N_{C1} = a\alpha$ and $N_{C2} = b\alpha$ are given using constants a and b, so that $N_{C1}$ and $N_{C2}$ do not include $D_R$ that has a singularity (pole). By formulas (2a) to (2d) and formula (4), $a = M_1L/l$, $b = M_1 + M_2 - a$. Here, particular note is to be taken on the point that constants a and b depend only on mass $M_1$, $M_2$ and on distances L and l, and do not depend on parameters that may vary depending on the state of plate stage PST, such as spring constant k, attenuation coefficient μ, viscosity C and the like. This means that the behavior of a closed loop transfer function is invariable to any variance in the state of plate stage PST, as long as resonance modes of $P_1$, $P_2$ are cancelled out in the closed loop transfer function, and mass $M_1$, $M_2$ of rigid bodies Tb, Cr (that is, mass of plate table PTB and carriage 30) and distances L and l do not vary.

On deciding $D_C$, a that remains, degrees of freedom remain to some extent. Therefore, as controllers $50_1$ and $50_2$, for example, a DID controller is to be designed. Accordingly, $D_C = s^2 + b_1s$ and $\alpha = b_2s^2 + b_3s + b_4$ are obtained. However, $b_1 = 4\omega_n - C/(M_1+M_2)$, $b_2 = 6\omega_n^2 - C/(M_1+M_2)b_1$, $b_3 = 4\omega_n^3$, and $b_4 = \omega_n^4$.

Incidentally, in exposure apparatus 110, there is an offset at a reference position of X position measurement of plate stage PST by interferometers 18X, $18X_1$, that is, an offset at an installation position of movable mirror 17X and corner cube $17X_1$. To remove this offset, a high pass filter (not shown) is connected to controller $50_2$ (transfer function $C_2$) so that controlled variable $X_2$ is eliminated in the low frequency band.

Figure 8A:
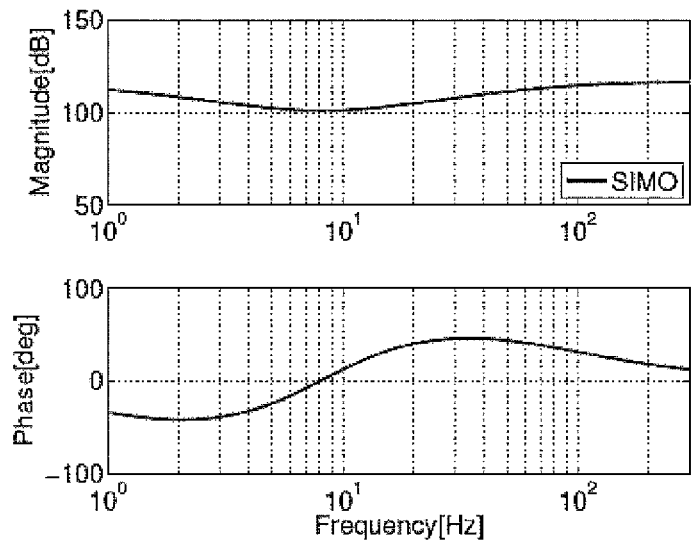
FIGS. 8A and 8B are Bode diagrams showing frequency response characteristics of transfer functions of two controllers in a feedback control system in a one-input two-output system.
Figure 8B:
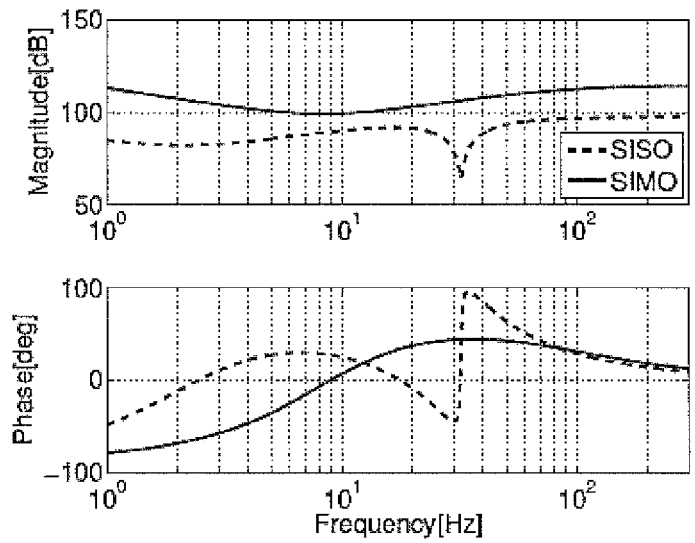

FIGS. 8A and 8B show a Bade diagram which illustrates a frequency response characteristic of transfer functions $C_2$ and $C_1$ of controllers $50_2$ and $50_1$ in a feedback control system of one-input two-output system (SIMO system) designed above, respectively. In both FIGS. 8A and 8B, the drawing on the upper side is a gain diagram, and the drawing on the lower side is a phase diagram. Here, for dynamic parameters included in transfer functions $C_1$, $C_2$, the values indicated in FIG. 7B are substituted. FIG. 8B, as a comparison example, also shows a frequency response characteristic (indicated by a broken line) of a transfer function of a controller (a combination of a PID type controller and a notch filter) in a conventional feedback control system which is a one-input one-output system (SISO system) (for example, refer to Japanese Unexamined Patent Application Publication No. 2006-203113). In this case, frequency band of the controller of the SISO system was 5 Hz ($\omega_n$=10$\pi$rad/s), frequency band of the controller of the SIMO system was 20 Hz ($\omega_n$=40$\pi$rad/s), and cutoff frequency of the high pass filter was 1 Hz.

While the transfer function of the controller of the conventional SISO system shows an abnormal behavior at around 30 Hz, none of the transfer functions $C_1$, $C_2$ of controllers $50_1$ and $50_2$ of the SIMO system show any abnormal behavior in all of the frequency bands.

The inventors verified performance of the feedback control system of the SING system structured using controllers $50_1$ and $50_2$ (transfer functions $C_1$, $C_2$) designed above by simulation. Here, dynamic movement (response characteristics) of plate stage PST is reproduced, using the rigid model (transfer functions $C_1$, $C_2$) previously described. In the simulation, three conditions are applied for the rigid model (transfer functions $C_1$, $C_2$). As condition A, a nominal model, that is, the values given in FIG. 7B are applied to all of the dynamic parameters, as condition B, a value 0.5 times the given value in FIG. 7B is applied to spring constant k, and the values given in FIG. 7B are applied to the other dynamic parameters, and as condition C, a value 5 times the given value in FIG. 7B is applied to moment of inertia $J_1$, and the values given in FIG. 7B are applied to the other dynamic parameters.

Figure 9A:
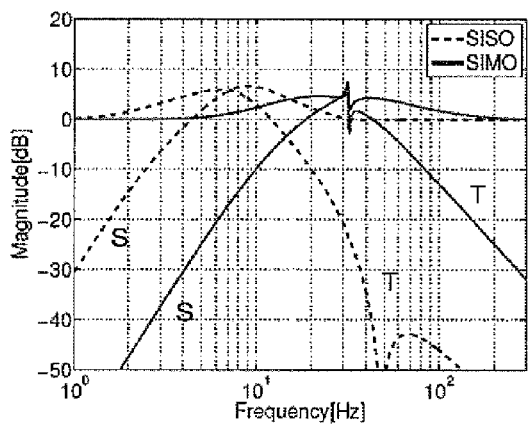
FIGS. 9A to 9C are Bode diagrams (simulation results) that respectively show a frequency response characteristic of a closed loop transfer function for each of the feedback control systems in a one-input two-output system (SING system) and a one-input one-output system (SISO system), for each condition A to C.
Figure 9B:
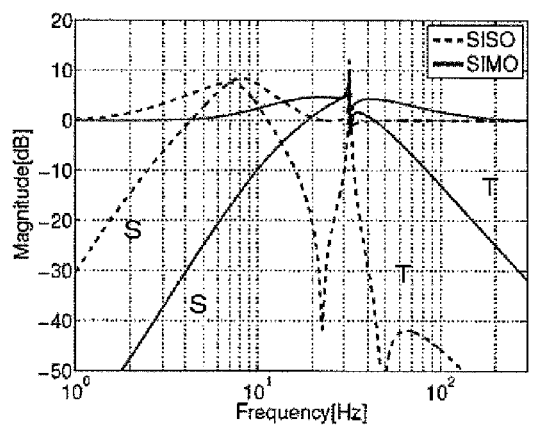
Figure 9C:
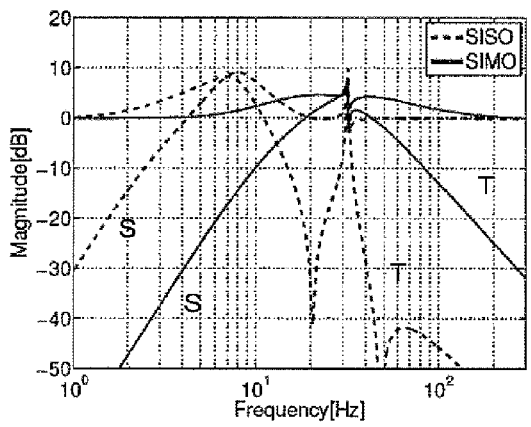

FIGS. 9A to 9C show a gain diagram which indicates a frequency response characteristic of a sensitivity function (closed loop transfer function) S (and T=1−S; T is a complementary sensitivity function) of the feedback control system of the SIMO system in the present embodiment for each of the conditions A to C. Further, as a comparison example, a gain diagram is also shown which indicates a frequency response characteristic of sensitivity function S (and T=1−S; T is a complementary sensitivity function) of the feedback control system of the SISO system previously described. Here, similarly to the description earlier, frequency band of the controller of the SISO system is to be 5 Hz ($\omega_n$=10$\pi$rad/s), frequency band of the controller of the SIMO system is to be 20 Hz ($\omega_n$=40$\pi$rad/s), and cutoff frequency of the high pass filter is to be 1 Hz.

In the frequency response characteristic for the nominal model shown in FIG. 9A, both the conventional feedback control system of the SISO system and the feedback control system of the SIMO system in the present embodiment do not show any abnormal behavior. Incidentally, although an abnormal behavior shows in the frequency response characteristic of the feedback control system of the SIMO system at around 30 Hz, this behavior is caused by a high pass filter and is a subtle behavior which can be ignored when performing system control.

In FIGS. 9B and 9C, the frequency response characteristic with respect to the conventional feedback control system of the SISO system varies greatly from the frequency response characteristic in FIG. 9A, and shows an abnormal behavior at around 30 Hz. The reason is as follows.

That is, as for condition A (nominal model) in FIG. 9A, since the bandwidth in which the resonance behavior (resonance mode) of plate stage PST appears coincides with the effective bandwidth of the notch filter, the operation of the notch filter restrained the resonance mode. However, by shifting the value of spring constant k under condition B in FIG. 93, and shifting the value of moment of inertia $J_1$ under condition C in FIG. 9C, the state of plate stage PST changed from the nominal model and the bandwidth in which the resonance mode appears shifted outside of the effective bandwidth of the notch filter, which kept the notch filter from operating to restrain the resonance mode.

On the other hand, the frequency response characteristic with respect to the feedback control system of the SIMO system in the present embodiment in FIGS. 9B and 9C does not change at all from the frequency response characteristic with respect to the nominal model in FIG. 9A. This is because as previously described, transfer functions $C_1$, $C_2$ (constants a and b) of controllers $50_1$ and $50_2$ depend only on mass $M_1$ and $M_2$, and distances L and l, and do not depend on parameters that may change according to the state of plate stage PST, such as spring constant k and the like. This result indicates that the feedback control system of the SIMO system in the present embodiment is robust to any changes in the state of plate stage PST.

Incidentally, in contrast to the conventional feedback control system of the SISO system, in the feedback control system of the SIMO system in the present embodiment, a disturbance suppression characteristic improves by around 30 dB at a low frequency band (equal to or below 10 Hz) which is especially important when driving plate stage PST.

Figure 10A:
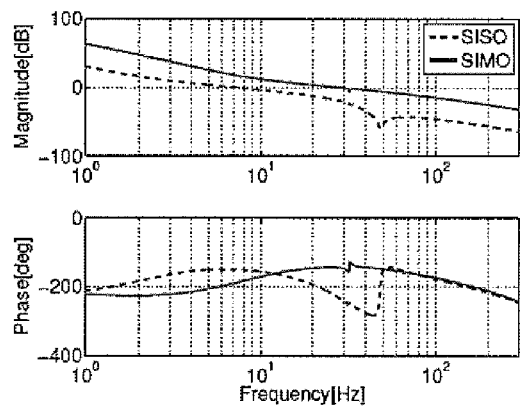
FIGS. 10A to 10C are Bode diagrams (simulation results) that respectively show a frequency response characteristic of an open loop transfer function for each of the feedback control systems in a one-input two-output system (SIMO system) and a one-input one-output system (SISO system), for each condition A to C.
Figure 10B:
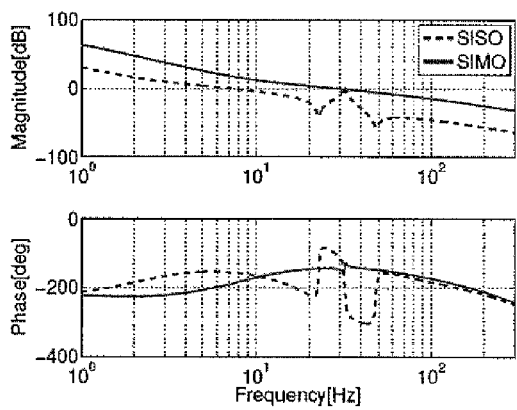
Figure 10C:
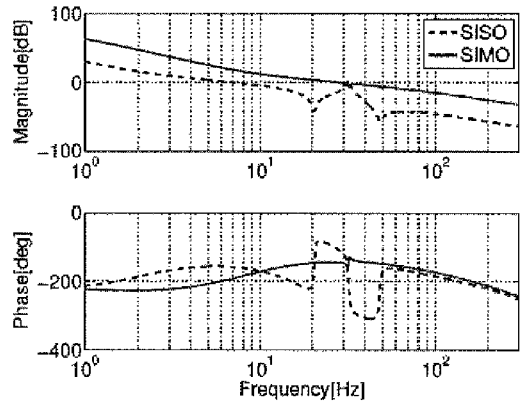

FIGS. 10A to 10C show a Bode diagram which indicates a frequency response characteristic of an open loop transfer function for both the feedback control system of the SING system in the present embodiment and the conventional feedback control system of the SISO system (comparison example), for each of the conditions A to C. In each of FIGS. 10A to 10C, the drawing on the upper side is a gain diagram, and the drawing on the lower side is a phase diagram. While the frequency response characteristic to the conventional feedback control system of the SISO system shows an abnormal behavior in the frequency at around 30 Hz, the frequency response characteristic to the feedback control system of the SIMO system in the present embodiment does not show any abnormal behavior in all of the frequency bands.

FIGS. 11A to 11C show a Nyquist diagram of both the feedback control system of the SIMO system in the present embodiment and the conventional feedback control system of the SISO system (comparison example), for each of the conditions A to C. In the conventional feedback control system of the SISO system, the Nyquist locus does not encircle the point at (−1,0) only with respect to the nominal model (condition A) so that the Nyquist stability criterion is satisfied, whereas, as for conditions B and C, the Nyquist locus encircles the point at (−1,0), therefore, the Nyquist stability criterion is not satisfied. On the other hand, in the feedback control system of the SIMO system in the present embodiment, the Nyquist locus does not encircle the point at (−1,0) for all conditions A to C, therefore, the Nyquist stability criterion is satisfied.

FIG. 12 shows a gain margin (Gm) and a phase margin (Pm), corresponding to conditions A to C. In the conventional feedback control system of the SISO system, in the nominal model (condition A), the gain margin is 9.7 dB, and the phase margin is 30.1 deg. Under conditions B and C, the system is unstable, and the gain margin and the phase margin cannot be defined. On the other hand, in the feedback control system of the SIMO system in the present embodiment, the gain margin is 17.8 dB and the phase margin is 35.7 deg for all conditions A to C. Normally, high bandwidth and stability gain are in a relation where one of the two improves while the other deteriorates. Nevertheless, although the frequency band of the controller is increased by four times, in the feedback control system of the SIMO system in the present embodiment, the gain margin and the phase margin are both dramatically improved than those of the conventional SISO system.

In a prototype that simulates exposure apparatus 110, the inventors built a feedback control system of a one-input two-output system (SIMO system) using controllers $50_1$ and $50_2$ (transfer functions $C_1$, $C_2$) as designed above, and verified the performance by experiment. In the experiment, three conditions A to C which are similar to the simulation performed earlier were employed.

Figure 13A:
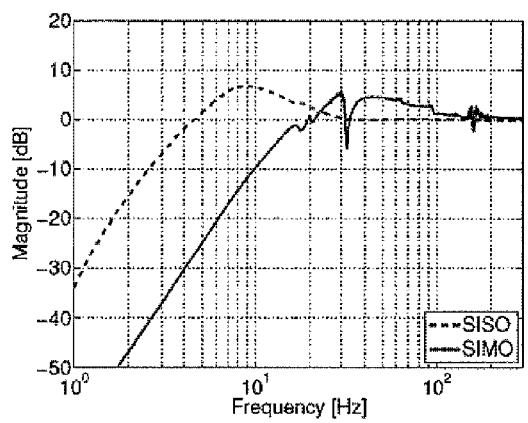
FIGS. 13A to 13C are Bode diagrams (experimental results) that respectively show a frequency response characteristic of a closed loop transfer function for each of the feedback control systems in a one-input two-output system (SIMO system) and a one-input one-output system (SISO system), for each condition A to C.
Figure 13B:
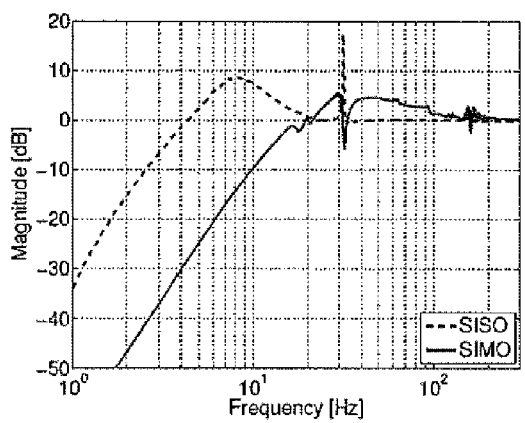
Figure 13C:
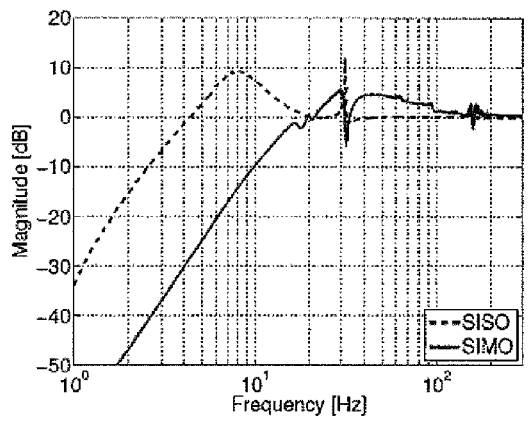

FIGS. 13A to 13C each show a gain diagram which indicates a frequency response characteristic of a sensitivity function S for the feedback control system of the one-input two-output system (SIMO system) of the present embodiment and for the feedback control system (comparison example) of the conventional one-input one-output system (SISO system), for each of the conditions A to C. Here, as previously described, the frequency band of the controller of the SISO system is to be 5 Hz ($\omega_n=10\pi$rad/s), the frequency band of the controller of the SIMO system is to be 20 Hz ($\omega_n=40\pi$rad/s), and the cutoff frequency of the high pass filter is to be 1 Hz.

The frequency response characteristic to the conventional feedback control system of the SISO system, as it can be seen from FIG. 13A, does not indicate any abnormal behavior under condition A (nominal model), however, as it is indicated in FIG. 13B and FIG. 13C, indicates an abnormal behavior at around 30 Hz under conditions B and C. On the other hand, while the frequency response characteristic to the feedback control system of the SIMO system in the present embodiment indicates a subtle abnormal behavior which is caused by the high pass filter at a level that can be ignored at around 30 Hz and a subtle abnormal behavior which is caused by high-order resonance mode in the high frequency band (100 Hz or more) for all conditions, except for such behaviors, no abnormal behaviors are indicated especially in the low frequency band which become an issue in exposure apparatus 110.

Figure 14A:
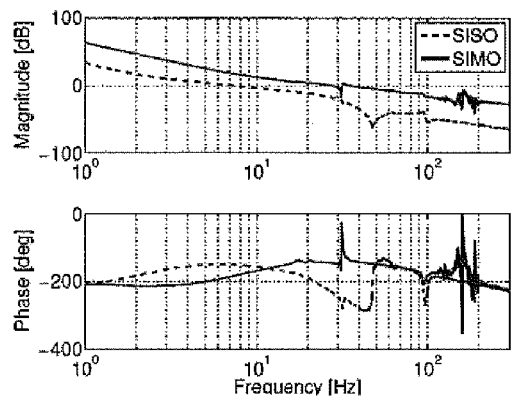
FIGS. 14A to 14C are Bode diagrams (experimental results) that respectively show a frequency response characteristic of an open loop transfer function for each of the feedback control systems in a one-input two-output system (SIMO system) and a one-input one-output system (SISO system), for each condition A to C.
Figure 14B:
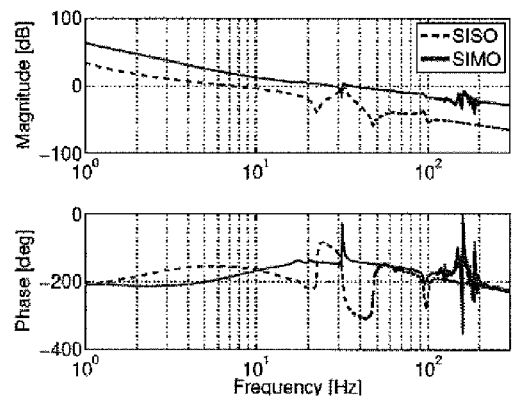
Figure 14C:
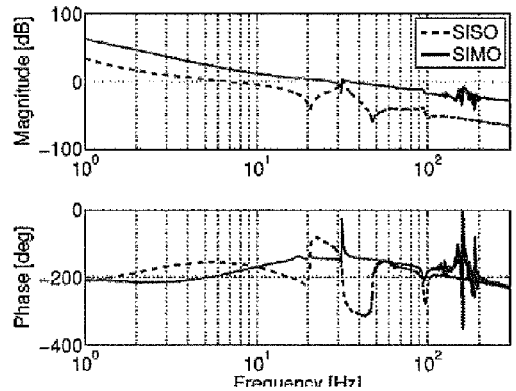

FIGS. 14A to 14C each show a Bode diagram which indicates a frequency response characteristic of an open loop transfer function for the feedback control system of the SIMO system in the present embodiment and for the conventional feedback control system of the SISO system (comparison example), for each of the conditions A to C. In each of FIGS. 14A to 14C, the drawing on the upper side is a gain diagram, and the drawing on the lower side is a phase diagram. The frequency response characteristic to the conventional feedback control system of the SISO system shows an abnormal behavior in the frequency at around 30 Hz, On the other hand, while the frequency response characteristic to the feedback control system of the SIMO system in the present embodiment indicates a subtle abnormal behavior which is caused by the high pass filter at a level that can be ignored at around 30 Hz and a subtle abnormal behavior which is caused by high-order resonance mode in the high frequency band (100 Hz or more) for all conditions, except for such behaviors, no abnormal behaviors are indicated especially in the low frequency band which become an issue in exposure apparatus 110.

Figure 15A:
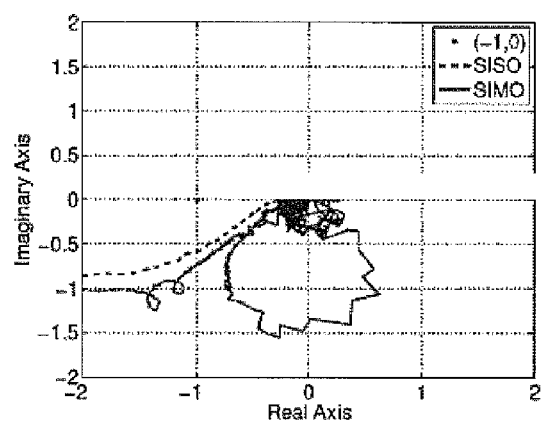
FIGS. 15A to 15C are Nyquist diagrams for each of the feedback control systems of a one-input two-output system (SING system) and a one-input one-output system (SISO system), for each condition A to C.
Figure 15B:
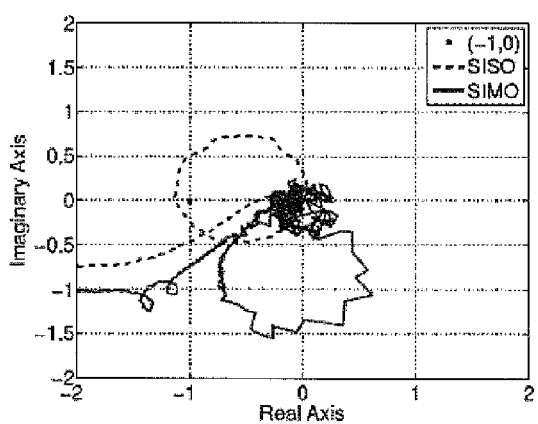
Figure 15C:
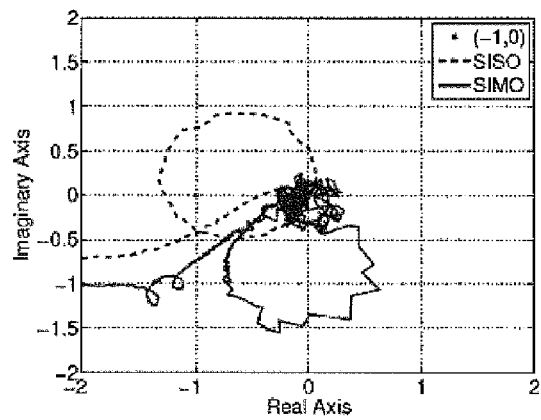

FIGS. 15A to 15C each show a Nyquist diagram for the feedback control system of the SIMO system in the present embodiment and for the conventional feedback control system of the SISO system (comparison example), for each of the conditions A to C. In the conventional feedback control system of the SISO system, the Nyquist locus does not encircle the point at (−1,0) only with respect to the nominal model (condition A) so that the Nyquist stability criterion is satisfied, whereas, as for conditions B and C, the Nyquist locus encircles the point at (−1,0), therefore, the Nyquist stability criterion is not satisfied. On the other hand, as for the feedback control system of the SIMO system in the present embodiment, the Nyquist locus does not encircle the point at (−1,0) for all conditions A to C, therefore, the Nyquist stability criterion is satisfied.

Figure 16A:
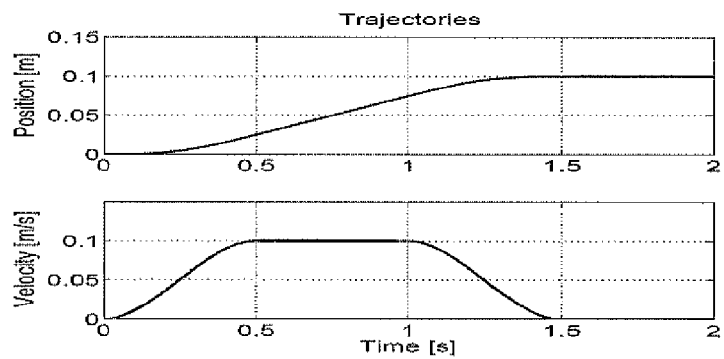
FIG. 16A is a view showing a driving trajectory of a plate stage.

The inventors, in the prototype simulating exposure apparatus 110, furthermore verified following performance of the feedback control system corresponding to desired value R for position of target trajectories (desired values on each of position and velocity) of plate stage PST shown in FIG. 16A.

Figure 16B:
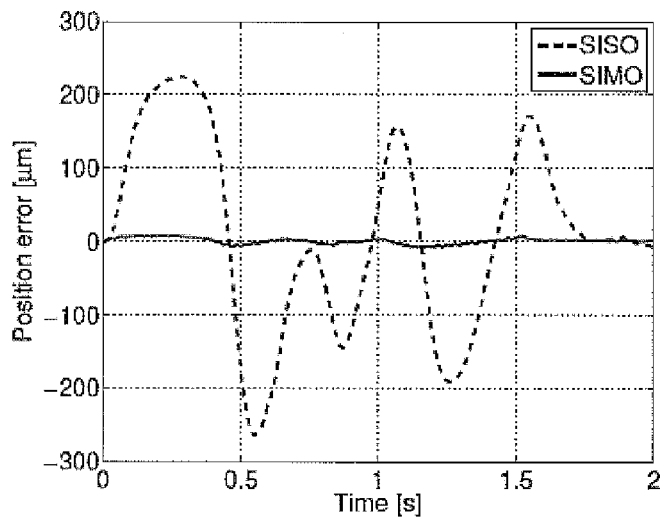
FIGS. 16B and 16C are views showing a change over time of a following error of a plate stage.
Figure 16C:
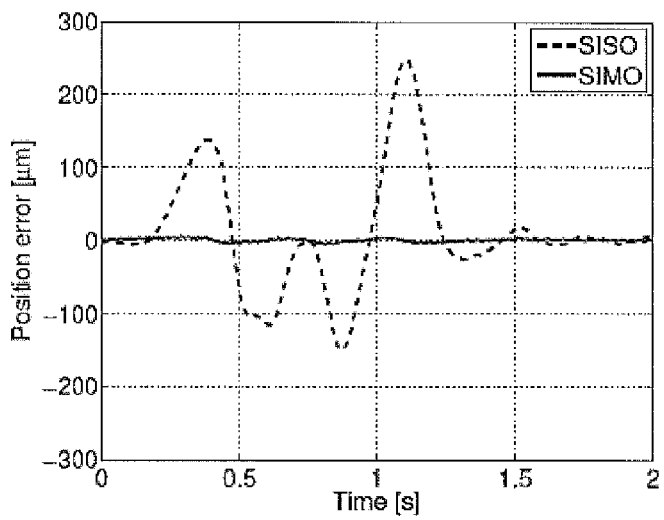

FIG. 16B shows a following error which changes over time of plate stage PST in both the feedback control system of the SIMO system in the present embodiment and the conventional feedback control system of the SISO system (comparison example). The following error becomes large especially at the time of acceleration of plate stage PST. As is obvious from FIG. 16B, it can be seen that in contrast with the conventional feedback control system of the SISO system, the following performance of plate stage PST has dramatically improved in the feedback control system of the SIMO system in the present embodiment. FIG. 16C shows a change over time of a following error in the case feedforward control is combined with feedback control. By combining feedforward control with the feedback control, it can be seen that the following performance is improved furthermore.

As is described so far, according to exposure apparatus 110 related to the present embodiment, interferometer $18X_1$ (the second measuring instrument) which measures position (the second controlled variable) $X_2$ of plate stage PST is installed at carriage 30 (the second section of the plant) which shows a resonance mode with respect to a rigid-body mode which is an opposite phase of a resonance mode shown by plate table PTB (the first section of the plant) where interferometer 18X (the first measuring instrument) which measures position (the first controlled variable) $X_1$ of plate stage PST (plant) is installed. By using the first and the second measuring instruments, it becomes possible to design a driving system robust in a high bandwidth that drives plate stage PST.

Further, on designing the driving system, in the operational expression $U(X_1, X_2)=C_1X_1+C_2X_2$ for obtaining the control input using the measurement results of position (the first and the second controlled quantities) $X_1$, $X_2$ of plate stage PST, transfer functions $C_1$, $C_2$ are decided so that poles corresponding to the resonance mode included in each of the transfer functions $P_1$, $P_2$ expressing the response of the first section and the second section (plate table PTB and carriage 30) of plate stage PST are canceled out in the open loop transfer function $C_1P_1+C_2P_2$. Furthermore, a specific form of transfer functions $P_1$, $P_2$ is given using a dynamic model (rigid model) which expresses the motion of the first section and the second section as a motion of two rigid bodies connected by a spring. This cancels out the resonance behaviors (resonance modes) of $P_1$, $P_2$ in the closed loop transfer function (cancels out the resonance mode of $P_1$ by the resonance mode of $P_2$), and as long as the mass (that is, the mass of plate table PTB and carriage 30) and distances L and l do not change, it becomes possible to design a driving system that can perform driving (position control) of plate stage PST robust to any change of state.

Further, according to exposure apparatus 110 related to the present embodiment, plate stage PST is driven, by measuring the first controlled variable (position) of the first section (plate table PTB) of plate stage PST and also measuring the second controlled variable (position) of the second section (carriage 30) of plate stage PST which shows the resonance mode to the rigid-body mode in opposite phase of the resonance mode shown in the first section, obtaining the control input by performing control operation based on the measurement results and the desired value, and giving the obtained control input to plate stage driving system PSD. This allows plate stage PST to be driven precisely and in a stable manner.

Further, because exposure apparatus 110 related to the present embodiment is equipped with a driving system of plate stage PST which is designed in the manner described above, plate stage PST can be driven precisely and in a stable manner, which allows the exposure accuracy, or in other words, the overlay accuracy to be improved.

Incidentally, in the present embodiment, while position was selected for the controlled variable of plate stage PST serving as the plant, instead of this, a physical quantity other than position such as velocity, acceleration and the like which is related to position can be selected as the controlled variable. In such a case, a velocity measuring instrument, an acceleration measuring instrument and the like which are independent from (interferometers 18X, 18Y, and $18X_1$ structuring) plate interferometer system 18 are to be installed, and velocity, acceleration and the like are to be measured using such instruments. Or, velocity and acceleration can be calculated and used, by a first order difference or a second order difference calculation of the measurement values of plate interferometer system 18.

Figure 17:
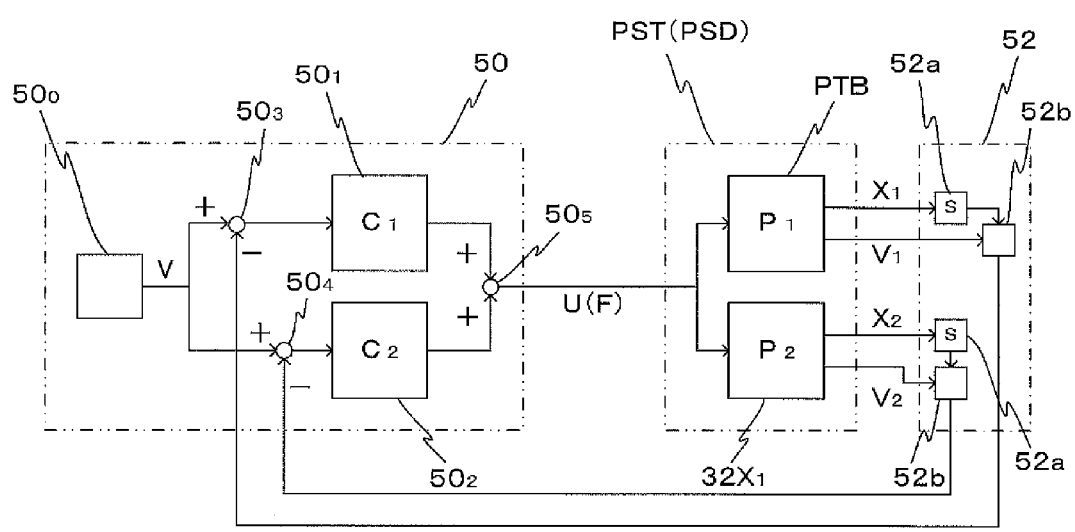
FIG. 17 is a block diagram expressing a modified example of a feedback control system of a one-input two-output system related to the first embodiment.

Further, the controlled variable of plate stage PST can be a plurality of combinations of physical quantities related to position, such as position, velocity, acceleration and the like. FIG. 17 shows a block diagram of a modified example of a feedback control system of a one-input two-output system related to the present embodiment. The feedback control system of this modified example, as a whole, structures a velocity control loop. Accordingly, target generating section $50_0$ generates a target velocity V as a desired value, and the controlled variable of plate stage PST serving as the plant should also be velocity. Position $X_1$ and velocity $V_1$ of the first section (plate table PTB) of plate stage PST are measured, respectively, by the first measuring instrument (interferometer 18X) structuring plate interferometer system 18 and the first velocity measuring instrument (not shown) which is independent from the first measuring instrument, and these measurement results are sent to a mixing section 52. Measurement results of position $X_1$ are synthesized by a mixing instrument 52b, via a differentiator 52a with measurement results of velocity $V_1$, and the synthesized results are fed back to subtracter $50_3$ of stage controller 50. Similarly, position $X_2$ and velocity $V_2$ of the second section (carriage 30) of plate stage PST are measured, respectively, by the second measuring instrument (interferometer $18X_1$) structuring plate interferometer system 18 and the second velocity measuring instrument (not shown) which is independent from the second measuring instrument, and these measurement results are sent to mixing section 52. Measurement results of position $X_2$ are synthesized by mixing instrument 52b, via differentiator 52a with measurement results of velocity $V_2$, and the synthesized results are fed back to subtracter $50_4$ of stage controller. Here, mixing instrument 52b, as an example, includes a high pass filter and a low pass filter that have the same cutoff frequency, and is structured to pass only one of the measurement results of position $X_1$, $X_2$ and velocity $V_1$, $V_2$, using these two filters. By this mixing type feedback control system, it becomes possible to drive (that is, to control velocity (and position) of) plate stage PST more precisely, and in a more stable manner.

Incidentally, in the embodiment described above, while the case has been described where plate stage PST is driven in the X-axis direction, a feedback control system can be designed in a similar manner also in the case of driving plate stage PST in the Y-axis direction and in the Z-axis direction, and an equivalent effect can be obtained.

A Second Embodiment

Next, a second embodiment will be described, based on FIGS. 6, and 18 to 24. Here, the same reference signs are to be used for identical or similar components as in the first embodiment previously described. Because the structure and the like of the exposure apparatus related to the second embodiment is similar to the first embodiment, description related to the structure of the apparatus and the like will be omitted. However, in the second embodiment, a driving system which drives plate stage PST in a rotating (tilt) direction (θx direction, θy direction, and θz direction) will be addressed, and the design and the like will be described. Here, as an example, a driving system will be described which drives plate stage PST in the θz direction.

In exposure apparatus 110, as is previously described, by making a driving force (thrust) in the X-axis direction generated by each of the X linear motors $36X_1$, $36X_2$ different, a torque τ is generated around the Z-axis, which drives carriage 30 and plate table PTB in the θz direction.

Further, the position of plate stage PST in the θz direction (yawing value, yaw angle), as is previously described, is measured by interferometer 18X of plate interferometer system 18. That is, interferometer 18X measures a θz position ($θz_1$) of plate table PTB. Further, based on a difference of measurement results of the X position of carriage 30 by each of the interferometers $18X_1$ and $18X_2$ of plate interferometer system 18, stage controller 50 can obtain a θz position ($θz_2$) of carriage 30.

A feedback control system of a one-input two-output system (SIMO system) shown in a block diagram of FIG. 6 is structured, using interferometers 18X, $18X_1$, and $18X_2$ of plate interferometer system 18. Incidentally, although the second measuring instrument which measures the θz position ($θz_2$) of carriage 30 which is the second section of the plant is structured from interferometers $18X_1$ and $18X_2$, hereinafter, for the sake of convenience, the second measuring instrument will be expressed as interferometer $18X_1$.

In the feedback control system related to the second embodiment shown in FIG. 6, interferometers 18X, $18X_1$, (the first measuring instrument and the second measuring instrument) measure, plate table PTB (the first section) of plate stage PST (plant) and the θz position (the first controlled variable $θz_1$ and the second controlled variable $θz_2$) of carriage 30 (the second section), respectively.

Measurement results ($θx_1$, $θz_2$) of the first controlled variable and the second controlled variable are supplied to stage controller 50. Stage controller 50 obtains control input U (torque τ) using the measurement results ($θz_1$, $θz_2$), and control input U which has been obtained is sent to plate stage driving system PSD which drives plate stage PST (plant). Plate stage driving system PSD (X linear motors $36X_1$, $36X_2$) applies a torque equivalent to torque τ to carriage 30 (the second section), by making the driving force (thrust) generated by X linear motors $36X_1$, $36X_2$ different from each other according to control input U (torque τ) which has been received. Accordingly, plate stage PST is driven in the θz direction, and the position in the θz direction is controlled. As is described, although drive of plate stage PST by stage controller 50 involves controlling the position of plate stage PST also in the second embodiment, this will simply be expressed as drive in the description below.

Target generating section $50_0$ included in stage controller 50 generates desired value R (in this case, a desired value of the θz position (yaw angle)) of plate stage PST, and supplies the desired value to subtracters $50_3$, $50_4$. One of the subtracters $50_3$ calculates a difference between desired value R and θz position $θz_1$ (current position) of plate table PTB measured by interferometer 18X, that is, calculates deviation (R−θz$_1$), and supplies the deviation to controller 50$_1$ (transfer function C$_1$). The other subtracter 50$_4$ calculates a difference between desired value R and θz position θz$_2$ (current position) of carriage 30 (transfer function P$_2$) measured by interferometer 18X$_1$, that is, calculates deviation (R−θz$_2$), and supplies the deviation to controller 50$_2$ (transfer function C$_2$).

Controller 50$_1$ calculates an intermediate variable C$_1$ (R−θz$_1$) by calculation (control operation) so that deviation (R−θz$_1$) becomes zero, and sends out the quantity to adder 50$_5$. Similarly, controller 50$_2$ calculates an intermediate variable C$_2$(R−θz$_2$) by control operation so that the deviation (R−θz$_2$) becomes zero, and sends out the quantity to adder 50$_5$.

Adder 50$_5$ adds the output (intermediate variable) of controllers 50$_1$ and 50$_2$, and obtains control input U. In this manner, stage controller 50 performs the control operation expressed by operational expression U(R−θz$_1$, R−θz$_2$)=C$_1$(R−θz$_1$)+C$_2$(R−θz$_2$) based on measurement results (θz$_1$, θz$_2$) of interferometers 18X, 18X$_1$, and desired value R and obtains control input U, and gives control input U to plate stage PST which is the plant. This drives plate stage PST in the θz direction, according to control input U.

In the present embodiment, to design controllers 50$_1$ and 50$_2$ (decide transfer functions C$_1$, C$_2$), a dynamic movement of plate stage PST is expressed, using a simplified dynamic model (rigid model). FIG. 18A shows a dynamic model of a typical two-inertial system. Here, plate stage PST is an example of the two-inertial system, and as shown in FIG. 1, the two-inertial system is to be structured of two parts, of plate table PTB where the first measuring instrument (interferometer 18X) is installed, and of carriage 30 where the second measuring instrument (interferometer 18X$_1$) is installed. And, motion (rotation) in the θz direction of these parts will be expressed as a rotational motion of two rigid bodies connected by a spring, or more specifically, as a rotational motion between a rigid body L2 (corresponding to carriage 30) to which torque z is given from the driving system corresponding to plate stage driving system PSD (X linear motors 36X$_1$, 36X$_2$), and rigid body L1 (corresponding to plate table PTB) connected to rigid body L2 via the spring.

Here, the θz positions of rigid body L1 and rigid body L2 are to be expressed as θz$_1$, θz$_2$, respectively, the moment of inertia are to be expressed as J$_1$ and J$_2$, respectively, and spring constant is to be expressed as k. Incidentally, FIG. 18B shows a table containing the values (real measurement values) of these dynamic parameters.

In the rigid model described above, transfer functions P$_1$, P$_2$ that indicate input-output response (response of controlled quantities θz$_1$, θz$_2$ to torque τ) of rigid bodies L1 and L2, are given as expressed below, in the form of a Laplace transform.

$$P_1(s) = \frac{\theta z_1}{\tau} = \frac{1}{J_2 s^2} \frac{\frac{k}{J_1}}{s^2 + \frac{k}{J_1}\left(1 + \frac{J_1}{J_2}\right)} \quad (6a)$$

$$P_2(s) = \frac{\theta z_2}{\tau} = \frac{1}{J_2 s^2} \frac{s^2 + \frac{k}{J_1}}{s^2 + \frac{k}{J_1}\left(1 + \frac{J_1}{J_2}\right)} \quad (6b)$$

FIGS. 19A and 19B show a Bode diagram which indicates a frequency response characteristic of transfer functions P$_2$, P$_1$, respectively. In both FIGS. 19A and 19S, the drawing on the upper side is a gain diagram, and the drawing on the lower side is a phase diagram. Transfer functions P$_1$, P$_2$ related to rotational motion of the two rigid bodies L1 and L2 indicate a behavior substantially the same as transfer functions P$_1$, P$_2$ (refer to FIG. 5A and FIG. 5B) related to translation motion of the two rigid bodies Cr and Tb in the rigid model (FIG. 7A) concerning translation motion. Transfer function P$_1$, as a basic behavior, monotonously decreases its magnitude with respect to an increase in frequency f, so that the phase is constantly maintained. And, transfer function P$_1$, as a resonance mode (resonance behavior), sharply increases and then decreases its magnitude and sharply decreases its phase, in around 60-odd Hz. These are indicated by a peaked shape and a stepped shape in the gain diagram and phase diagram of FIG. 19B, respectively. Meanwhile, the frequency response characteristic of transfer function P$_2$ shows a resonance mode (resonance behavior) which is opposite to the frequency response characteristic of transfer function P$_1$, that is, shows a resonance mode in opposite phase. That is, transfer function P$_2$, as a basic behavior, monotonously decreases its magnitude with respect to an increase in frequency f, so that the phase is constantly maintained. And, in transfer function P$_2$, its magnitude sharply decreases and then increases in around 60-odd Hz, and its phase sharply increases and decreases. These are indicated by a successive trough and peak, and a pulse, respectively, in the gain diagram and phase diagram of FIG. 19A, respectively.

Accordingly, because transfer function P$_1$ corresponding to rigid body L1 (plate table PTB) shows a resonance mode in opposite phase of the rigid-body mode, and transfer function P$_2$ corresponding to rigid body L2 (carriage 30) shows a resonance mode in phase with the rigid-body mode, similarly to the first embodiment, a feedback control system of a one-input two-output system (SIMO system) can be structured which cancels out the resonance behavior of plate table PTB (transfer function P$_1$) with the resonance behavior of carriage 30 (transfer function P$_2$).

Transfer functions C$_1$, C$_2$ are decided, using transfer functions P$_1$, P$_2$ described above. For the sake of convenience, transfer functions P$_1$, P$_2$, C$_1$, and C$_2$ will be expressed in the form of a fractional expression, P$_1$=N$_{P1}$/D$_P$D$_R$, P$_2$=N$_{P2}$/D$_P$D$_R$, C$_1$=N$_{C1}$/D$_C$, C$_2$=N$_{C2}$/D$_C$. Here, $$N_{P1} = k/J_1 \quad (7a)$$

$$N_{P2} = s^2 + k/J_1 \quad (7b)$$

$$D_2 = J_2 s^2 \quad (7c)$$

$$D_R = s^2 + (k/J_1)(1 + J_1/J_2) \quad (7d).$$

In this case, in characteristic equation A$_{CL}$ (formula (3)) of the closed loop transfer function of the feedback control system (FIG. 6), N$_{C1}$ and N$_{C2}$ are decided so that formula (4) is satisfied, using arbitrary analytical function α. From this, an open loop transfer function C$_1$P$_1$+C$_2$P$_2$=α/D$_C$D$_P$ is obtained, and an extreme zero offset is performed on poles (that is, resonance modes that P$_1$, P$_2$ each show) that give resonance behavior included in each of P$_1$, P$_2$. Furthermore, D$_C$, α are decided, so that characteristic equation A$_{CL}$ will have a stable pole (in the description, for the sake of convenience, becomes a multiple root), or in other words, formula (5) is satisfied.

Next, a specific form of transfer functions C$_1$, C$_2$ (N$_{C1}$, N$_{C2}$, D$_C$, α) is decided. Using constants a and b, N$_{C1}$=aα and N$_{C2}$=bα are given so that N$_{C1}$ and N$_{C2}$ do not contain D$_R$ having a singularity (pole), as in the first embodiment. From formulas (7a) to (7d) and formula (4), decided are a=J$_1$/J$_2$, b=1. Here, it is to be noted that constants a and b depend only on moment of inertias J$_1$ and J$_2$, and do not depend on spring constant k, or in other words, on a parameter that can change according to the state of plate stage PST. $D_C$, α that remain are decided to $D_C = s^2 + b_1 s$, $α = b_2 s^2 + b_3 s + b_4$, by designing PID type controllers $50_1$ and $50_2$. However, $b_1 = 4ω_n$, $b_2 = 6J_2 ω_n^2$, $b_3 = 4J_2 ω_n^3$, and $b_4 = J_2 ω_n^4$.

Figure 20A:
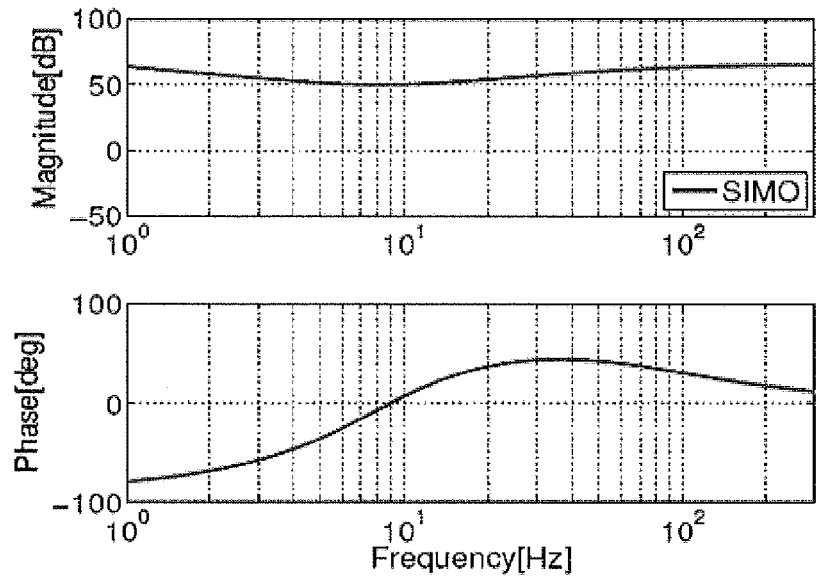
FIGS. 20A and 20B are Bode diagrams that respectively show a frequency response characteristic of a transfer function of two controllers in a feedback control system of a one-input two-output system related to the second embodiment.
Figure 20B:
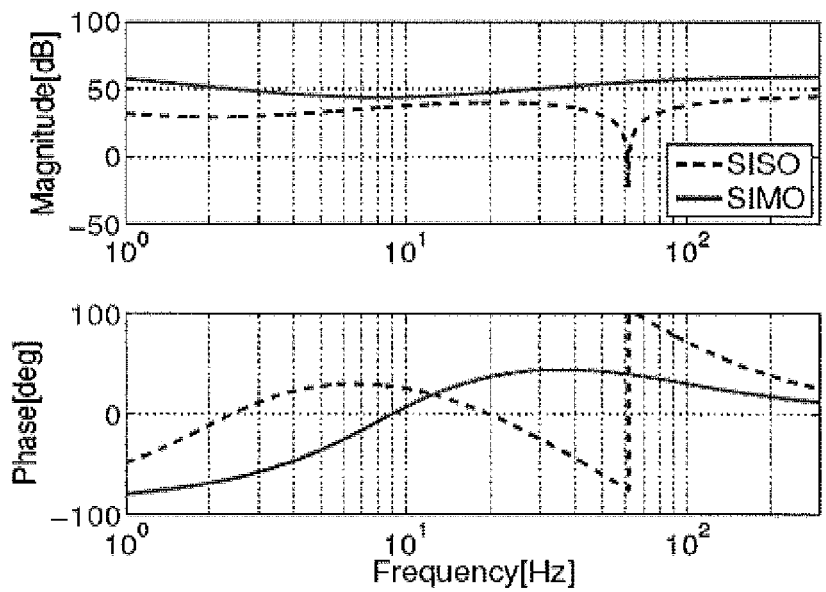

FIGS. 20A and 20B show a Bode diagram which indicates a frequency response characteristic of transfer functions $C_2$ and $C_1$ of controllers $50_2$ and $50_1$ in the feedback control system of the one-input two-output system (SIMO system) designed above. In both FIGS. 20A and 20B, the drawing on the upper side is a gain diagram, and the drawing on the lower side is a phase diagram. Here, the values shown in FIG. 18B are each substituted into the dynamic parameters included in transfer functions $C_1$, $C_2$. FIG. 20B, as a comparison example, shows a frequency response characteristic of a transfer function of a controller (a combination of a PID-type controller and a notch filter) in a feedback control system of a conventional one-input one-output system (SISO system) (refer to, for example, Japanese Unexamined Patent Application Publication No. 2006-203113). Here, the frequency band of the controller of the SISO system was 5 Hz ($ω_n = 10π$ rad/s), and the frequency band of the controller of the SIMO system was 20 Hz ($ω_n = 40$ π rad/s).

While the transfer function of the controller of the conventional SISO system shows an abnormal behavior at around 60 Hz, transfer functions $C_1$, $C_2$ of the controllers $50_1$ and $50_2$ of the SIMO system do not show any abnormal behaviors in any of the frequency bands.

The inventors verified by simulation the performance of the feedback control system of the one-input two-output system (SIMO system) which is structured using controllers $50_1$ and $50_2$ (transfer functions $C_1$, $C_2$) designed in the manner described above. Here, dynamic movement (response characteristics) of plate stage PST is reproduced, using the rigid model previously described (transfer functions $P_1$, $P_2$).

Figure 21:
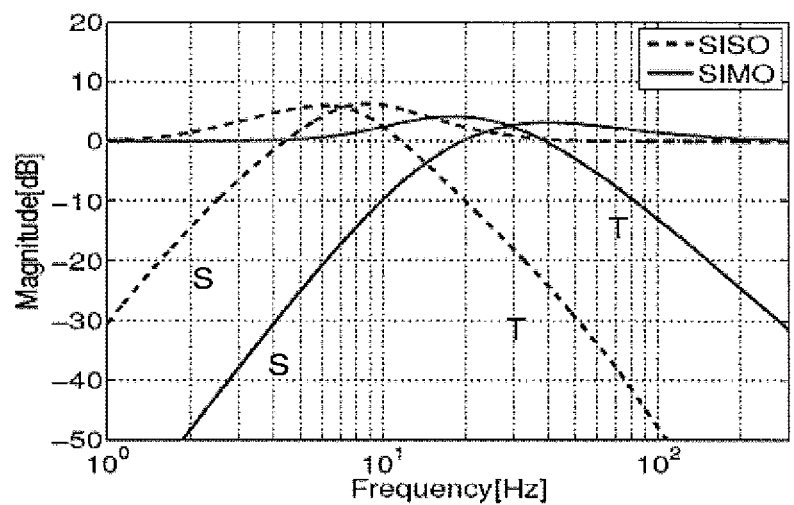
FIG. 21 is a Bode diagram (simulation result) showing a frequency response characteristic of a closed loop transfer function of a feedback control system for each of a one-input two-output system (SIMO system) related to the second embodiment and a conventional one-input one-output system (SISO system).

FIG. 21 shows a gain diagram which indicates a frequency response characteristic of a sensitivity function S (and T=1−S; T is a complementary sensitivity function) corresponding to each of the feedback control system of the SIMO system in the present embodiment and the feedback control system of the conventional SISO system (comparison example). In both feedback control systems, the closed loop transfer functions do not show any abnormal behaviors in any of the frequency bands.

However, compared to the conventional feedback control system of the SISO system, in the feedback control system of the SIMO system in the present embodiment, the disturbance suppression characteristic has improved by around 30 dB in the low frequency band (10 Hz or below) which is especially important when driving plate stage PST.

Figure 22:
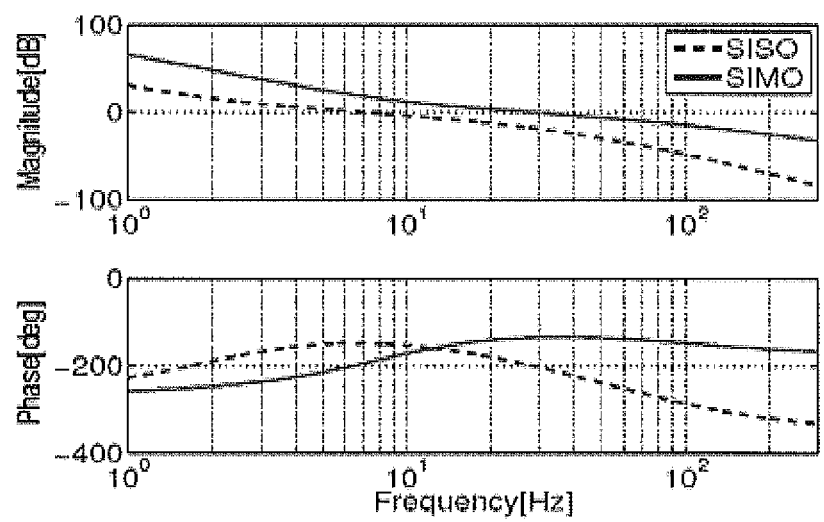
FIG. 22 is a Bode diagram (simulation result) showing a frequency response characteristic of an open loop transfer function of a feedback control system for each of a one-input two-output system (SIMO system) related to the second embodiment and a conventional one-input one-output system (SISO system).

FIG. 22 shows a Bode diagram which indicates a frequency response characteristic of an open loop transfer function corresponding to each of the feedback control system of the SIMO system in the present embodiment and the feedback control system of the conventional SISO system (comparison example). In FIG. 22, the drawing on the upper side is a gain diagram, and the drawing on the lower side is a phase diagram. In both feedback control systems, the open loop transfer functions do not show any abnormal behavior in the entire frequency band.

Figures 23, 24:
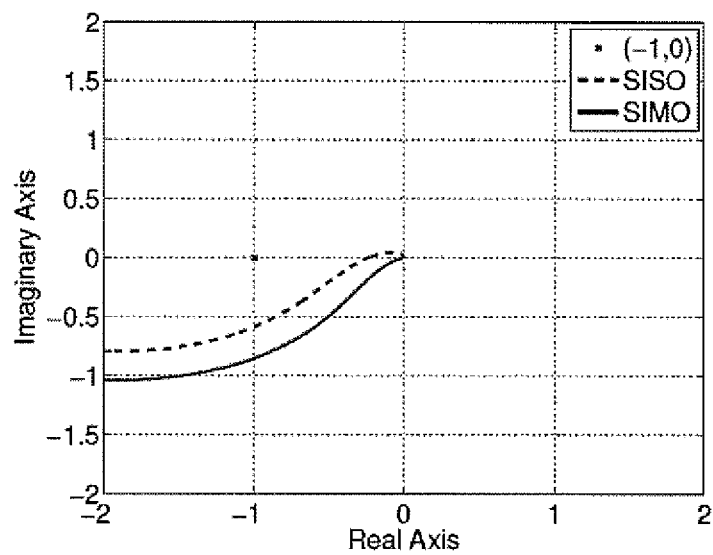
FIG. 23 is a Nyquist diagram of a feedback control system for each of a one-input two-output system (SIMO system) related to the second embodiment and a conventional one-input one-output system (SISO system).
FIG. 24 is a table showing a gain margin (Gm) and a phase margin (Pm).

FIG. 23 shows a Nyquist diagram for each of the feedback control system of the SIMO system in the present embodiment and the feedback control system of the conventional SISO system (comparison example). In both feedback control systems, the Nyquist locus do not encircle the point at (−1,0), therefore, the Nyquist stability criterion is satisfied.

FIG. 24 shows a gain margin (Gm) and a phase margin (Pm). For the conventional feedback control system of the SISO system, gain margin is 12.2 dB, and phase margin is 30.2 deg. On the contrary, in the feedback control system of the SIMO system in the present embodiment, the gain margin is infinite, and the phase margin is 43.5 deg. Although the frequency band of the controller is increased by four times, in the feedback control system of the SIMO system in the present embodiment, the gain margin and the phase margin are both dramatically improved than those of the conventional SISO system.

As is described so far, according to the exposure apparatus related to the second embodiment, interferometer $18X_1$ (the second measuring instrument) that measures position (the second controlled variable) $θz_2$ of plate stage PST is installed at carriage 30 (the second section of the plant) which shows a resonance mode to a rigid-body mode that is in opposite phase of a resonance mode shown by plate table PTB (the first section of the plant) where interferometer 18X (the first measuring instrument) that measures position (the first controlled variable) $θz_1$ of plate stage PST (plant) is installed. By using the first measuring instrument and the second measuring instrument, it becomes possible to design a driving system which is robust in a high bandwidth that drives (controls the θz position of) plate stage PST, also for driving plate stage PST in the rotation direction, similarly to driving plate stage PST in the translation direction described in the first embodiment.

Further, on designing the driving system, in operational expression $U(θz_1, θz_2) = C_1 θz_1 + C_2 θz_2$ for obtaining a control input using measurement results of positions (the first and the second controlled quantities) $θz_1$, $θz_2$ of plate stage PST, transfer functions $C_1$, $C_2$ are decided so that poles corresponding to resonance modes included in each of the transfer functions $P_1$, $P_2$ expressing the response of the first section and the second section (plate table PTB and carriage 30) of plate stage PST are canceled out in the open loop transfer function $C_1 P_1 + C_2 P_2$. Furthermore, a specific form of transfer functions $P_1$, $P_2$ is given, using a dynamic model (rigid model) which expresses a motion of the first section and the second section as a motion of two rigid bodies connected by a spring. This cancels out the resonance modes (resonance behaviors) of $P_1$, $P_2$ in the closed loop transfer function (the resonance mode of $P_1$ is canceled out by the resonance mode of $P_2$), and as long as the moment of inertia (that is, the moment of inertia of plate table PTB and carriage 30) of the first section and the second section does not change, a driving system of plate stage PST which is robust to any change of state can be designed.

Further, according to the exposure apparatus related to the second embodiment, plate stage PST is driven by measuring the first controlled variable (position (rotation position) in the θz direction) of the first section (plate table PTB) of plate stage PST, as well as measuring the second controlled variable (position (rotation position) in the θz direction) of the second section (carriage 30) of plate stage PST which shows a resonance mode to a rigid-body mode in opposite phase of a resonance mode shown by the first section, and obtaining a control input performing a control operation based on the measurement results and desired values, and giving the control input which has been obtained to plate stage driving system PSD. This allows plate stage PST to be driven precisely and in a stable manner.

Further, because the exposure apparatus related to the second embodiment is equipped with a driving system of plate stage PST designed in the manner described above, it becomes possible to drive plate stage PST precisely and in a stable manner, which in turn allows exposure accuracy, that is, overlay accuracy to be improved.

Incidentally, in the second embodiment described above, while rotation position was selected as the controlled variable of plate stage PST serving as the plant, instead of this, a physical quantity other than rotation position that is related to rotation position, such as rotation velocity, rotation acceleration and the like can be selected as the controlled variable. In such a case, a rotation velocity measuring instrument, a rotation accelerometer and the like independent from (interferometers 18X, 18Y, $18X_1$, and $18X_2$ structuring) plate interferometer system 18 should be installed, and rotation velocity, rotation acceleration and the like should be measured using such instruments. Alternatively, rotation velocity and rotation acceleration which are calculated from a first order difference or a second order difference calculation of the measurement values of plate interferometer system 18 can also be used.

Further, similarly to the modified example (FIG. 17) corresponding to the first embodiment, the controlled variable of plate stage PST can be a combination of a plurality of physical quantities related to rotation position, such as rotation velocity, rotation acceleration and the like.

Further, in the present embodiment, while the case has been described where plate stage PST is driven in the θz direction, a feedback control system can be designed similarly also in the case when plate stage PST is driven in the θx direction and in the θy direction, and an equivalent effect can be obtained.

Incidentally, in the exposure apparatuses related to the first embodiment and the second embodiment described above, the first measuring instrument (interferometer 18X (movable mirror 17X)) was installed at plate table PTB (the first section of plate stage PST) which shows a resonance mode in opposite phase of the rigid-body mode, and the second measuring instrument (interferometer $18X_1$ (and interferometer $18X_2$) (corner cube $17X_1$ (and $X_2$))) was installed at carriage 30 (the second section of plate stage PST) which shows a resonance mode in phase with the rigid-body mode, and a feedback control system was structured using the first measuring instrument and the second measuring instrument. However, the invention is not limited to this, and for example, in the case of a semi-closed control and the like using a sensor (the first measuring instrument) placed at a position (section) which shows a resonance mode in phase with the rigid-body mode of the plant (plate stage PST), a sensor (the second measuring instrument) can be (added) placed at a position (section) which shows a resonance mode in opposite phase of the rigid-body mode of the plant, and a feedback control system similar to the first and the second embodiments described above can be structured so as to suppress vibration that occurs on the load side.

Further, in the first embodiment and the second embodiment described above, while a driving system that drives plate stage PST precisely in a stable manner was structured, with plate stage PST serving as a plant of a gantry type structured from two sections (or three sections or more) which are a carriage moving in the scanning direction of the plate and a plate table moving in the non-scanning direction while holding the plate supported above the carriage, the present invention is not limited to this, and a driving system can be structured similarly to the first embodiment and the second embodiment, also for a coarse/fine movement type substrate stage that has two sections (or three sections or more) which are a coarse movement stage moving in a two dimensional direction and a fine movement stage that moves finely supported on the coarse movement stage while holding the plate (substrate).

A Third Embodiment

Next, a third embodiment will be described, based on FIGS. 25 and 26. Here, the same reference signs are to be used for identical or similar components as in the first embodiment previously described, and the description thereabout will be brief or omitted.

In the third embodiment, different from the first embodiment and the second embodiment previously described, a case will be described where a driving system is structured of a moving stage consisting of a single section, as an example, a driving system whose plant is mask stage MST in exposure apparatus 110.

Here, as an example, drive of mask stage MST in the scanning direction (the X-axis direction) will be described.

Figure 25:
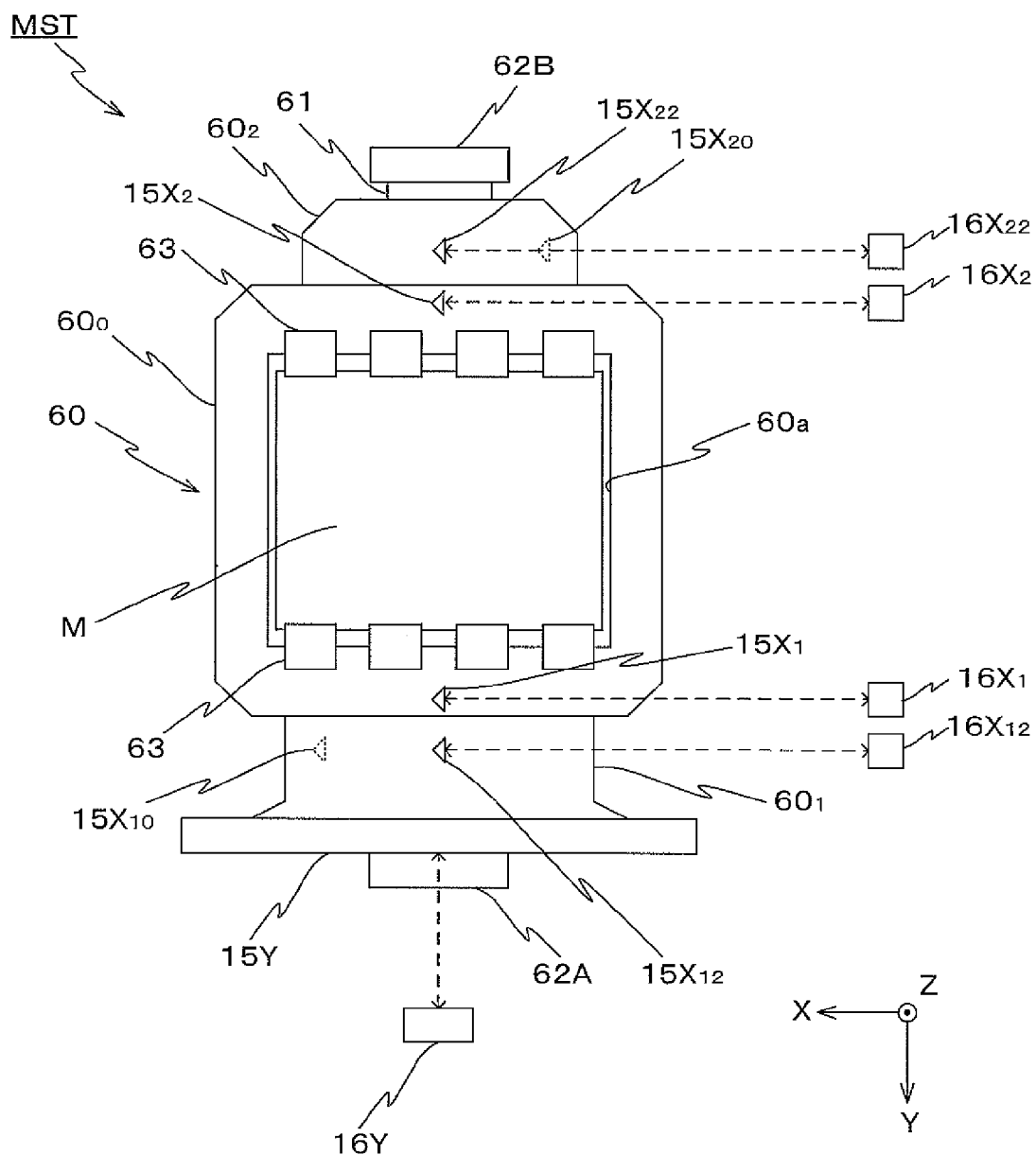
FIG. 25 is a planar view showing a structure of a mask stage.

Mask stage MST, as shown in FIG. 25, is equipped with a mask stage main section 60, and a pair of movers 62A, 62B provided via support members 61 (the support member on the +Y side is not shown) on one side and the other side in the Y-axis direction of mask stage main section 60, respectively.

Mask stage main section 60 has a frame shaped section $60_0$ which has a rectangular shape in a planar view (when viewed from above), and slider sections $60_1$, $60_2$ which are integrally provided on the +Y side and the −Y side of frame shaped section $60_0$. To the +Y end surface of one of the slider sections $60_1$, a movable mirror 15Y is fixed consisting of a flat mirror that has a reflection surface perpendicular to the Y-axis. That is, slider section $60_1$ also is a mirror support member. Around the center of frame shaped section $60_0$, a recess section 60a of a rectangular shape in a planar view is formed, and in the center of the inner bottom surface of recess section 60a, an opening (not shown) where illumination light IL passes is formed.

At the +Y side and the −Y side of recess section 60a on the upper surface of frame shaped section $60_0$, four each of a mask holding mechanism 63 is provided. The ±Y ends of mask M housed within recess section 60a are pressed by eight mask holding mechanisms 63 and are fixed to frame shaped section $60_0$.

In the center on the +Y side end and on the −Y side end of frame shaped section $60_0$, corner cubes $15X_1$, $15X_2$ are fixed, respectively. Further, in the center of slider sections $60_1$, $60_2$, corner cubes $15X_{12}$, $15X_{22}$ are fixed, respectively.

Slider sections $60_1$, $60_2$ are supported by levitation via gas static bearings (for example, air bearings) which are not shown, on the pair of mask stage guides (not shown) previously described.

The pair of movers 62A, 62B each engages with its corresponding stator (not shown), and structures a pair of linear motors that structure mask stage driving system MSD. By the pair of linear motors, mask stage MST is driven in the scanning direction (the X-axis direction), and is also finely driven in the non-scanning direction (the Y-axis direction).

Position of mask stage MST is measured by mask interferometer system 16 (refer to FIG. 3). Mask interferometer system 16, as is shown in FIG. 25, has interferometers 16Y, $16X_1$, $16X_2$, $16X_{12}$, and $16X_{22}$. Interferometer 16Y measures the Y position of mask stage MST by irradiating a measurement beam parallel to the Y-axis on movable mirror 15Y fixed to mask stage MST, and receiving the reflected light. Interferometers $16X_1$, $16X_2$ measure the X position of frame shaped section $60_0$ of mask stage MST by irradiating measurement beams on corner cubes $15X_1$, $15X_2$ on frame shaped section $60_0$, respectively, and receiving the reflected lights, respectively. Interferometers $16X_{12}$, $16X_{22}$ measure the X position of slider sections $60_1$, $60_2$ of mask stage MST by irradiating measurement beams on corner cubes $15X_{12}$, $15X_{22}$ on slider sections $60_1$, $60_2$, respectively, and receiving the reflected lights, respectively.

Figure 26:
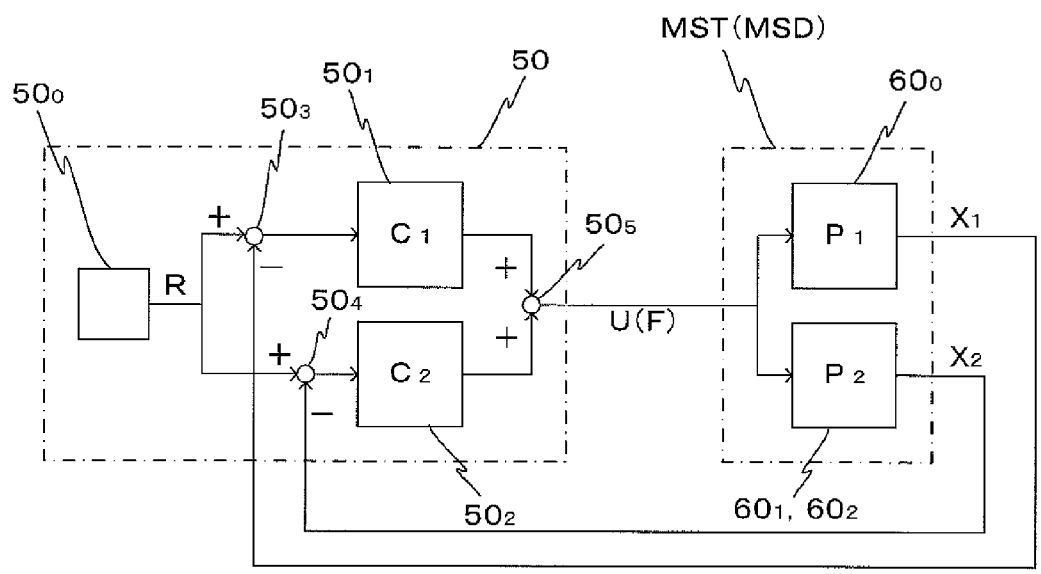
FIG. 26 is a block diagram expressing a feedback control system of a one-input two-output system related to a third embodiment.

In the third embodiment, a feedback control system of a one-input two-output system (SIMO system) expressed in a block diagram of FIG. 26 is structured, using interferometers $16X_1$, $16X_2$, $16X_{12}$, and $16X_{22}$ that structure mask interferometer system 16. The basic structure of the feedback control system is similar to the basic structure of the feedback control system in the first embodiment and the second embodiment previously described. That is, interferometers $16X_1$, $16X_2$ (the first measuring instrument) measure the X position (the first controlled variable $X_1$) of frame shaped section $60_0$ (the first section) of mask stage MST (a plant), and interferometers $16X_{12}$, $16X_{22}$ (the second measuring instrument) measure the X position (the second controlled variable $X_2$) of the second section (slider sections $60_1$, $60_2$, movers 62A, 62B, and movable mirror 15Y) of mask stage MST (plant). The measurement results ($X_1$, $X_2$) are supplied to stage controller 50. Incidentally, in the case of measuring the X position of mask stage MST by interferometers $16X_1$, $16X_2$, while the X position (the first controlled variable $X_1$) of mask stage MST is obtained from measurement results of either of the interferometers $16X_1$ or $16X_2$ or from an average of both of the measurement results, in the present embodiment, for convenience of explanation, interferometers $16X_1$, $16X_2$ (the first measuring instrument) are to measure the first controlled variable $X_1$. From a similar intent, interferometers $16X_{12}$, $16X_{22}$ (the second measuring instrument) are to measure the second controlled variable $X_2$. Further, while the second section of mask stage MST (plant) includes movers 62A, 623 and movable mirror 15Y besides slider sections $60_1$, $60_2$, the description below will be appropriately made with slider sections $60_1$, $60_2$ being the second section.

Stage controller 50 obtains control input U (driving force F) using the measurement results ($X_1$, $X_2$), and sends the obtained control input U to mask stage driving system MSD which drives mask stage MST (plant). According to control input U (driving force F) which has been received, mask stage driving system MSD applies a driving force equivalent to driving force F to movers 62A, 62B of the pair of linear motors. This allows mask stage MST to be driven in the X-axis direction.

In FIG. 26, target generating section $50_0$ included in stage controller 50 generates a desired value for controlling mask stage MST, in this case, target position (a desired value of the X position which changes with each passing moment) R in the X-axis direction, and supplies the desired value to subtracters $50_3$, $50_4$.

One of the subtracters $50_3$ calculates a difference between X position $X_1$ (current position) of frame shaped section $60_0$ (transfer function $P_1$) of mask stage MST (plant) measured by interferometers $16X_1$, $16X_2$ and target position R, or in other words, calculates deviation (R–$X_1$), and supplies the deviation to controller $50_1$ (transfer function $C_1$). The other subtracter $50_4$ calculates a difference between X position $X_2$ (current position) of slider sections $60_1$, $60_2$ (transfer function $P_2$) of mask stage MST (plant) measured by interferometers $16X_{12}$, $16X_{22}$ and target position R, or in other words, calculates deviation (R–$X_2$), and supplies the deviation to controller $50_2$ (transfer function $C_2$).

Controller $50_1$ calculates intermediate variable $C_1(R–X_1)$ by calculation (control operation) so that deviation (R–$X_1$) becomes zero, and sends the quantity to adder $50_5$. Similarly, controller $50_2$ calculates intermediate variable $C_2(R–X_2)$ by control operation so that deviation (R–$X_2$) becomes zero, and sends the quantity to adder $50_5$.

Adder $50_5$ adds the output (intermediate variable) of controllers $50_1$ and $50_2$, and obtains control input U. As is described so far, stage controller 50 obtains control input U by performing control operation expressed as operational expression $U(R–X_1, R–X_2)=C_1(R–X_1)+C_2(R–X_2)$, based on the measurement results ($X_1$, $X_2$) of the first and the second measuring instruments (interferometers $16X_1$, $16X_2$ and $16X_{12}$, $16X_{22}$) and target position R, and gives control input U to mask stage MST serving as a plant. By this operation, mask stage MST is driven in the X-axis direction according to control input U.

Mask stage MST can be regarded as a composite stage that has two sections connected, which are the first section structured by frame shaped section $60_0$ and the second section structured by slider sections $60_1$, $60_2$ (and movers 62A, 62B and movable mirror 15X). In such a composite stage, distortion (bending) of the entire stage occurs due to lack of rigidity at the connecting section, and this causes an input-output response of the first section $60_0$ and the second sections $60_1$, $60_2$, that is, frequency response characteristics of transfer functions $P_1$ (=$X_1$/U) and $P_2$ (=$X_2$/U) that express the response of the first controlled variable $X_1$ and the second controlled variable $X_2$ to control input U (driving force F) to show a behavior conflicting each other (a resonance mode in opposite phase), similarly to the frequency response characteristics shown in FIGS. 5A and 5B.

Therefore, controllers $50_1$ and $50_2$ are designed (transfer functions $C_1$, $C_2$ are decided) similarly to the first and the second embodiments. Here, dynamic movement of mask stage MST is expressed using a similar model as the rigid model shown in FIGS. 7A and 18A. This mutually cancels out the resonance mode of $P_1$, $P_2$, which allows driving (position control) of mask stage MST which is robust in a high bandwidth.

In mask stage MST related to the third embodiment, reference positions (installation positions of corner cubes $15X_1$, $15X_2$, and $15X_{12}$, $15X_{22}$) of position measurement by interferometers $16X_1$, $16X_2$, and $16X_{12}$, $16X_{22}$, are appropriately selected to a section of mask stage MST showing a resonance mode in opposite phase to each other. In this case, it is most desirable to place the sensors (corner cubes used in the interferometers) at a position where resonance ratio is constant even if the resonance frequency changes, taking robustness into consideration. From such a perspective, for example, in FIG. 25, corresponding to the reference positions (installation positions of corner cubes $15X_1$, $15X_2$) of interferometers $16X_1$, $16X_2$ (the first measuring instrument), the installation positions (the reference positions of interferometers $16X_{12}$, $16X_{22}$ (the second measuring instrument)) of corner cubes $15X_{12}$, $15X_{22}$ can be changed to positions $15X_{10}$ and $15X_{20}$ which are indicated using dotted lines in FIG. 25.

As is described so far, according to the exposure apparatus related to the third embodiment, a driving system similar to the one previously described in the first and the second embodiments can be structured not only for a composite stage structured from a plurality of sections (constituent elements) as in plate stage PST, but also for a moving stage structured of a single section (that can be regarded as a composite stage structured of a plurality of sections due to lack of rigidity) as in mask stage MST, and an equivalent effect can be obtained. Further, in the case of a semi-closed control and the like that uses a sensor (the first measuring instrument) placed at a position (section) showing a resonance mode in phase with the rigid-body mode of the plant (mask stage MST), a sensor (the second measuring instrument) can be (added) placed at a position (section) which shows a resonance mode in opposite phase of the rigid-body mode of the plant, and a feedback control system similar to the description above can be structured so as to suppress vibration that occurs on the load side.

Incidentally, in the third embodiment described above, while position is selected as the controlled variable of mask stage MST which is the plant, instead of this, a physical quantity other than position that is related to position, such as velocity, acceleration and the like can be used as the controlled variable. In such a case, a velocity measuring instrument, an accelerometer and the like independent from mask interferometer system 16 are to be installed, and velocity, acceleration and the like are to be measured, using such instruments. Alternatively, velocity and acceleration can be calculated and used, by a first order difference or a second order difference calculation of the measurement values of plate interferometer system 18.

Further, similarly to the modified example (FIG. 17) of the first embodiment previously described, a plurality of physical quantities related to position, such as position, velocity, acceleration and the like can be combined as the controlled variable of mask stage MST.

Further, in the third embodiment described above, while the case has been described where mask stage MST is driven in the X-axis direction, a feedback control system can be designed (and structured) similarly, also in the case when mask stage MST is driven in the Y-axis direction and the Z-axis direction.

Further, similarly to the second embodiment previously described, a feedback control system can be designed (and structured) also in the case of driving mask stage MST in the rotation (tilt) direction (the θx direction, the θy direction, and the θz direction).

A Fourth Embodiment

Next, a fourth embodiment will be described, based on FIGS. 27 to 29.

The fourth embodiment covers a case where a driving system is structured in which a feed screw type (for example, a ball screw type) plate stage, made up of a plate table holding a plate and a driving section for feeding the plate table in the scanning direction by rotating a feed screw screwed together (combined) with a nut provided in the plate table around its axis, is subject to driving.

The feed screw type plate stage is employed, mainly in a stationary type (step-and-repeat method) projection exposure apparatus. Since the structure of a stationary type exposure apparatus is well known, hereinafter, only the plate stage will be described, and description on the structure and the like of other sections will be omitted.

Figure 27A:
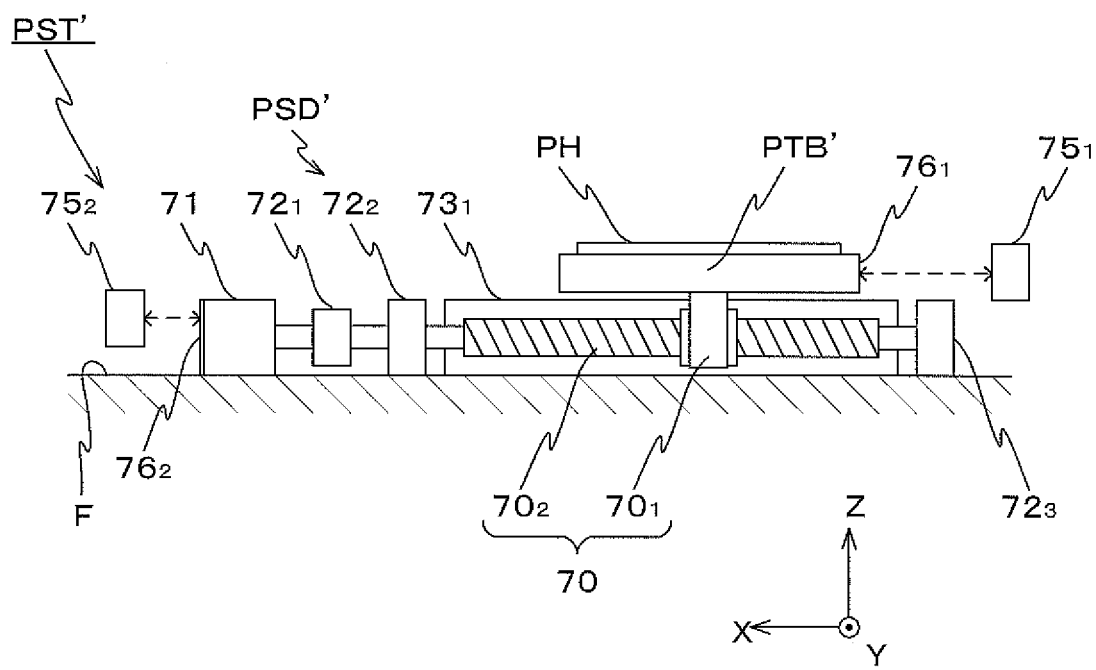
FIGS. 27A and 27B are views showing a structure of a ball screw type plate stage related to a fourth embodiment.
Figure 27B:
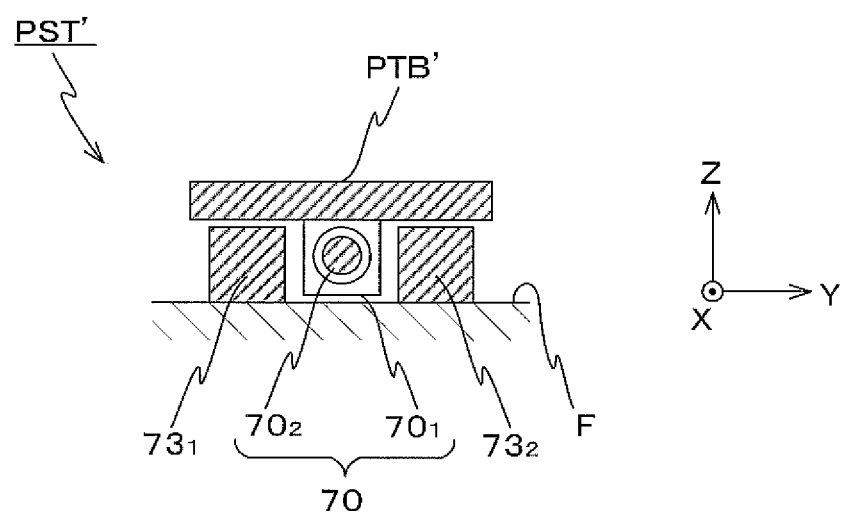

FIGS. 27A and 27B show a structure of a feed screw type plate stage PST' related to the fourth embodiment. Plate stage PST' is equipped with a plate table PTB' that holds the plate and a driving section PSD' that drives plate table PTB' in the X-axis direction.

On plate table PTB', a plate holder PH that holds the plate by suction is fixed in the center. To the −X end surface of plate table PTB', mirror-polishing is applied so as to form a reflection surface $76_1$. To the bottom surface of plate table PTB', a ball nut (hereinafter, shortly referred to as nut) $70_1$ is fixed in the center.

Plate table PTB' is placed so that its bottom surface faces the upper surface of a pair of guides $73_1$, $73_2$ extending in the X-axis direction which is fixed on floor surface F with nut $70_1$ in between in the Y-axis direction, and is supported above the pair of guides $73_1$, $73_2$ in a non-contact state (supported in a levitated manner), via a gas static bearing (for example, an air bearing) which is not shown.

Driving section PSD' is equipped with a screw shaft $70_2$ which structures ball screw 70 together with nut $70_1$, and a rotary motor 71 which rotates screw shaft $70_2$ around its axis. Screw shaft $70_2$ has a shaft section of a predetermined length and a screw section which is provided integrally and coaxially at a section excluding both ends in the longitudinal direction of the shaft section whose diameter is larger than that of the shaft section. The screw section of screw shaft $70_2$ is screwed together (in engagement with) with nut $70_1$ via multiple balls (not shown). The −X end of the shaft section of screw shaft $70_2$ is supported freely rotatable by a bearing $72_3$ fixed on floor surface F, and the +X end is supported freely rotatable by a different bearing $72_2$ fixed on floor surface F at a position to the −X side from the +X end. The +X end of the shaft section of screw shaft $70_2$ is connected to the shaft of rotary motor 71 via a coupling $72_1$ for connecting the shafts. The main section of rotary motor 71 is placed on floor surface F. Here, a thrust bearing (not shown?) is provided in bearing $72_2$, and this absorbs the force acting on screw shaft $70_2$ in its axis direction (the X-axis direction).

In plate stage PST' having the structure described above, rotary motor 71 rotates screw shaft $70_2$ around its axis (the θx direction), and ball screw 70 converts rotation of screw shaft $70_2$ into translation of nut $70_1$, which drives plate table PTB' in the X-axis direction.

The X position of plate table PTB' is measured by an interferometer $75_1$. Interferometer $75_1$ measures X position (X) of plate table PTB' by irradiating a measurement beam on a reflection surface $76_1$ of plate table PTB', and receiving the reflected light.

Rotation (θx) of rotary motor 71 is measured by a rotary encoder (encoder) $75_2$. Encoder $75_2$ receives light from a light-emitting element (not shown) via a rotary slit $76_2$ fixed to the rotary shaft of rotary motor 71. This allows rotation (θx) of rotary motor 71 to be measured.

Figure 28:
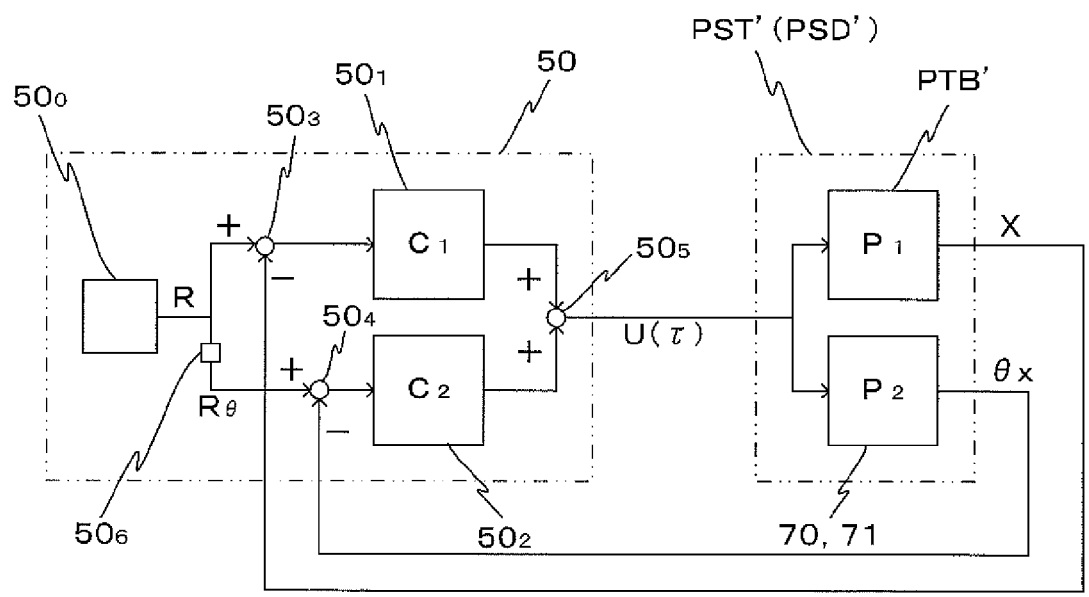
FIG. 28 is a block diagram expressing a feedback control system of a one-input two-output system related to the fourth embodiment.

In the fourth embodiment, a feedback control system of a one-input two-output system (SIMO system) shown by a block diagram of FIG. 28 is structured, using interferometer $75_1$ and encoder $75_2$. In this feedback control system, interferometer $75_1$ (the first measuring instrument) and encoder $75_2$ (the second measuring instrument) measure an X position (the first controlled variable X) of plate table PTB' structuring plate stage PST' (plant) and a rotation position (the second controlled variable θx) of rotary motor 71, respectively. These measurement results (X, θx) are supplied to stage controller 50. Stage controller 50 obtains a control input U (torque τ) using measurement results (X, θx), and the obtained control input U is sent to driving section PSD'. Driving section PSD' makes rotary motor 71 generate a torque equivalent to torque τ according to control input U (torque τ) that has been received. This drives plate table PTB'.

In FIG. 28, target generating section $50_0$ included in stage controller 50 generates a desired value R of the X position of plate table PTB', and supplies desired value R to subtracter $50_3$ and a converter $50_6$.

Subtracter $50_3$ calculates a difference between X position X (current position) of plate table PTB' (transfer function $P_1$) of plate stage PST' (plant) measured by interferometer $75_1$ and target position R, that is, calculates deviation (R−X), and supplies the deviation to controller $50_1$ (transfer function $C_1$). Converter $50_6$ converts desired value R of the X position to a θX position (rotation position of rotary motor 71) $R_θ$ which is equivalent (corresponds) to desired value R, and supplies the converted value to subtracter $50_4$. The other subtracter $50_4$ calculates a difference between rotation position θx (current position) of rotary motor 71 (transfer function $P_2$) of plate stage PST' (plant) measured by encoder $75_2$ and θX position $R_\theta$, that is, calculates deviation ($R_\theta-\theta x$), and supplies the deviation to controller $50_2$ (transfer function $C_2$).

Controller $50_1$ calculates intermediate variable $C_1$ (R–X) by calculation (control operation) so that deviation (R–X) becomes zero, and sends the intermediate variable to adder $50_5$. Similarly, controller $50_2$ calculates intermediate variable $C_2(R_\theta-\theta x)$ by control operation so that deviation ($R_\theta-\theta x$) becomes zero, and sends the intermediate variable to adder $50_5$.

Adder $50_5$ adds the output (intermediate variable) of controllers $50_1$ and $50_2$, and obtains control input U. As is described, stage controller 50 obtains control input U by performing control operation expressed in operational expression U(R–X, $R_\theta-\theta x$)=$C_1$(R–X)+$C_2(R_\theta-\theta x)$ based on measurement results (X, $\theta x$) of the first and the second measuring instruments (interferometer $75_1$ and encoder $75_2$) and target position (R, $R_\theta$), and gives control input U to plate stage PST' serving as the plant. This allows plate stage PST' to be driven according to control input U.

Figure 29A:
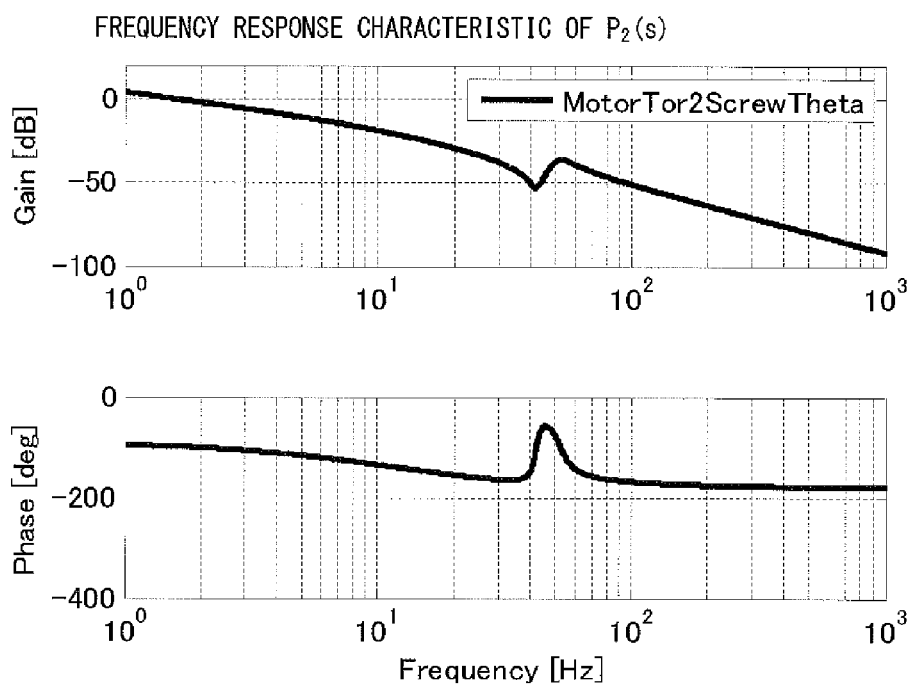
FIGS. 29A and 29B are Bode diagrams that respectively show a frequency response characteristic of a transfer function expressing an input-output response of a feed screw (and rotary motor) of a plate stage related to the fourth embodiment and a plate table.
Figure 29B:
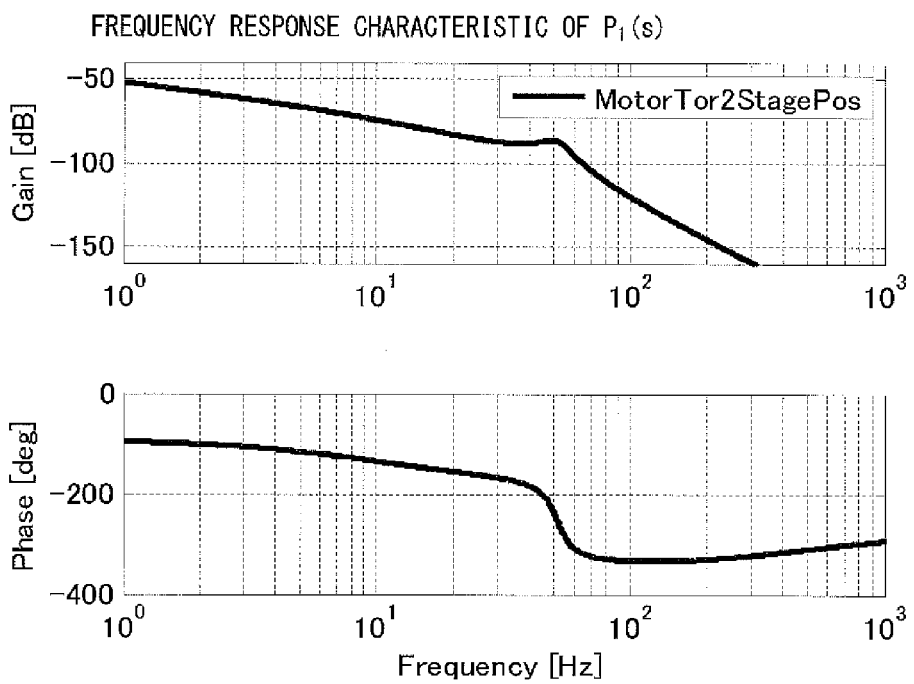

FIGS. 29A and 29B each show a Bode diagram of an input-output response of rotary motor 71 and plate table PTB', that is, a frequency response characteristic of transfer functions $P_2$ (=$\theta x$/U) and $P_1$ (=X/U) which expresses a response of controlled quantities $\theta x$, X with respect to control input U (torque $\tau$). In both FIGS. 29A and 293, the view on the upper side is a gain diagram, and the view on the lower side is a phase diagram. Transfer functions $P_2$, $P_1$ show a behavior in much the same way as transfer functions $P_2$, $P_1$ (FIG. 5A and FIG. 5B) derived from the rigid model (refer to FIG. 7A) related to translation motion and as transfer functions $P_2$, $P_1$ (FIG. 19A and FIG. 19B) derived from the rigid model (refer to FIG. 18A) related to rotational motion. That is, transfer functions $P_1$, $P_2$ show a behavior conflicting each other (a resonance mode in opposite phase). (Transfer function $P_1$ shows a resonance mode in opposite phase of a rigid-body mode, and transfer function $P_2$ shows a resonance mode in phase with the rigid-body mode.).

The behavior of transfer functions $P_1$, $P_2$ described above is considered to be caused by a lack in rigidity at the connecting section (ball screw 70 and the like) of plate table PTB' and rotary motor 71. Accordingly, dynamic movement of plate table PTB' and rotary motor 71 can be expressed as a motion of two rigid bodies connected by a spring, as in the rigid model shown in FIGS. 7A and 18A.

Accordingly, by designing controllers $50_1$ and $50_2$ (deciding transfer functions $C_1$, $C_2$) applying the rigid models of FIGS. 7A and 18A similarly to the first to the third embodiments previously described, the resonance modes of transfer functions $P_1$, $P_2$ are mutually canceled out, and it becomes possible to drive plate table PTB' (plate stage PST') robust in a high bandwidth.

As is described above so far, according to the fourth embodiment, a driving system can be structured similarly to the first embodiment to the third embodiment, with the feed screw type plate stage PST' in which translation motion of plate table PTB' and rotational motion of rotary motor 71 are combined serving as the plant, and an equivalent effect can be obtained. Further, in the case of a semi-closed control and the like that uses a sensor (the first measuring instrument) placed at a position (section) showing a resonance mode in phase with the rigid-body mode of the plant (feed screw type plate stage), a sensor (the second measuring instrument) can be (added) placed at a position (section) which shows an opposite phase of the rigid-body mode of the plant, and a feedback control system of the SIMO system similar to the description above can be structured so as to suppress vibration that occurs on the load side.

Incidentally, in the fourth embodiment described above, while position was selected as the controlled variable of plate table PTB', instead of this, a physical quantity related to position other than position such as velocity, acceleration and the like can also be selected as the controlled variable. In such a case, a velocity measuring instrument, an accelerometer and the like independent from interferometer $75_1$ are to be installed, and velocity, acceleration and the like are to be measured, using such instruments. Alternatively, velocity and acceleration can be calculated and used, by a first order difference or a second order difference calculation of the measurement values of plate interferometer system 18.

Further, similarly to the modified example (FIG. 17) corresponding to the first embodiment, a plurality of physical quantities related to position, such as position, velocity, acceleration and the like can be combined as the controlled variable of plate table PTB'.

Incidentally, in the fourth embodiment described above, while rotation position was selected as the controlled variable of rotary motor 71, instead of this, a physical quantity other than rotation position that is related to position, such as rotation velocity, rotation acceleration and the like can be selected as the controlled variable. In such a case, a rotation velocity measuring instrument, a rotation accelerometer and the like independent from encoder $75_2$ should be installed, and rotation velocity, rotation acceleration and the like should be measured using such instruments. Alternatively, rotation velocity and rotation acceleration can be calculated from a first order difference or a second order difference calculation of the measurement values of encoder $75_2$ and then be used.

Further, similarly to the modified example (FIG. 17) corresponding to the first embodiment, a plurality of physical quantities related to rotation position, such as rotation position, rotation velocity, rotation acceleration and the like can be combined as the controlled variable of rotary motor 71.

Incidentally, in each of the embodiments above, the case has been described where a driving system is structured with plate stage PST and/or mask stage MST serving as a plant in an exposure apparatus. However, this is not limited to an exposure apparatus, and the driving system (SIMO system) in each of the embodiments above can be applied also to a device which requires precise and stable driving (control of position or velocity and the like), such as for example, to a movable stage in an engineering device, or to a carrier device and the like as in a robot arm.

Further, the driving system can be similarly applied not only to the main resonance but also to a high-order resonance which is equal to or higher than a secondary resonance, such as by adding measuring instruments.

Incidentally, the structure of plate interferometer system 18 and mask interferometer system 16 is not limited to the structure in the first, the second, and the third embodiments described above, and a structure can be employ where more interferometers are added appropriately, depending on the purpose. Further, instead of plate interferometer system 18, or together with plate interferometer system 18, an encoder (or an encoder system made up of a plurality of encoders) can be used. Further, instead of mask interferometer system 16, or together with mask interferometer system 16, an encoder (or an encoder system made up of a plurality of encoders) can be used.

Incidentally, the exposure apparatus related to each of the embodiments described above is effectively applied, especially to an exposure apparatus which exposes a substrate having the size (long side or diameter) of 500 mm or more, such as to an exposure apparatus that exposes a large substrate for a flat panel display (FPD) as in a liquid crystal display device.

Further, in the exposure apparatus related to each of the embodiments described above, the illumination light can be an ultraviolet light such as an ArF excimer laser light (wavelength 193 nm), a KrF excimer laser light (wavelength 248 nm) or the like, or a vacuum-ultraviolet light such as an $F_2$ excimer laser light (wavelength 157 nm) or the like. Further, as the illumination light, for example, a harmonic wave can also be used which is a single-wavelength laser beam in the infrared or visible range emitted by a DFB semiconductor laser or a fiber laser that is amplified by a fiber amplifier doped with, for example, erbium (or both erbium and ytterbium), and whose wavelength is converted into a vacuum-ultraviolet light using a nonlinear optical crystal. Further, a solid laser (wavelength: 355 nm, 266 nm) and the like can also be used.

Further, in the embodiments described above, while the case has been described where projection optical system PL is a multi-lens projection optical system which is equipped with a plurality of optical systems, the number of projection optical systems is not limited to this, and can be one or more. Further, the projection optical system is not limited to a multi-lens projection optical system, and can be, for example, an Offner type projection optical system which uses a large mirror. Further, in the embodiments described above, while the case has been described where an equal magnifying is used for projection optical system PL, the present invention is not limited to this, and the projection optical system can be either a magnifying system or a reduction system.

Incidentally, in each of the embodiments described above, while a light transmissive type mask (reticle) in which a predetermined light-shielding pattern (or a phase pattern or a light-attenuation pattern) is formed on a light-transmitting substrate is used, instead of this mask, as disclosed in, for example, U.S. Pat. No. 6,778,257, an electron mask (a variable shaped mask) on which a light-transmitting pattern, a reflection pattern, or an emission pattern is formed according to electronic data of the pattern that is to be exposed, such as for example, a variable shaped mask that uses a DMD (Digital Micro-mirror Device) that is a type of a non-emission type image display element (spatial light modulator) can also be used.

Further, each of (the stage driving systems in) the embodiments described above can be applied to both a scanning type exposure apparatus including a collective exposure type or a scanning stepper, and to a stationary type exposure apparatus such as a stepper. Further, each of the embodiments described above can also be applied to a projection exposure apparatus that employs a step-and-stitch method in which a shot area and a shot area are synthesized. Further, each of the embodiments described above can also be applied to an exposure apparatus by a proximity method that does not use any projection optical systems, as well as to a liquid immersion type exposure apparatus that exposes a substrate via an optical system and a liquid. Furthermore, each of the embodiments described above can also be applied to an exposure apparatus whose details are disclosed in, for example, U.S. Pat. No. 6,611,316 and the like, that synthesizes two patterns on a substrate via a projection optical system, and by performing scanning exposure once, performs double exposure of one shot area on the substrate almost simultaneously.

Furthermore, the usage of the exposure apparatus is not limited to the exposure apparatus used for liquid crystal displays used to transfer a liquid crystal display device pattern on a square shaped glass plate, but can also be widely applied, for example, to an exposure apparatus for producing semiconductor devices, or to an exposure apparatus used to manufacture a thin film magnetic head, a micromachine, a DNA chip and the like. Further, each of the embodiments described above can also be applied not only to an exposure apparatus for producing microdevices such as semiconductor devices, but also to an exposure apparatus which transfers a circuit pattern on a glass substrate or a silicon wafer, in order to manufacture a mask or a reticle used in a light exposure apparatus, an EUV exposure apparatus, an X-ray exposure apparatus, and an electron beam exposure apparatus and the like. Incidentally, the object subject to exposure is not limited to a glass plate, and can be, for example, other objects such as a wafer, a ceramic substrate, or a mask blank and the like.

Electronic devices such as liquid crystal display devices (or semiconductor devices) are manufactured through the steps of; a step where the function/performance design of the device is performed, a step where a mask (or a reticle) based on the design step is manufactured, a step where a glass plate (or a wafer) is manufactured, a lithography step where the pattern of the mask (reticle) is transferred onto the glass plate by the exposure apparatus and its exposure method in each of the embodiments described above, a development step where the glass plate that has been exposed is developed, an etching step where the an exposed member of an area other than the area where the resist remains is removed by etching, a resist removing step where the resist that is no longer necessary when etching has been completed is removed, a device assembly step, an inspection step and the like. In this case, in the lithography step, because the device pattern is formed on the glass plate by executing the exposure methods previously described using the exposure apparatus in the embodiments described above, a highly integrated device can be produced with good productivity.

Incidentally, the disclosures of all the Publications and the U.S. patents that are cited in the description so far related to exposure apparatuses and the like are each incorporated herein by reference.

INDUSTRIAL APPLICABILITY

The driving system and the driving method of the present invention are suitable for driving a plant with good accuracy in a stable manner. Further, the exposure apparatus and the exposure method of the present invention are suitable for forming a pattern on an object. Further, the driving system design method of the present invention is suitable for designing a driving system whose plant is a stage or the like.

What is claimed is:

1. A driving system which drives a plant by giving a control input, the system comprising:
   a first measuring instrument which measures a first controlled variable related to a position of a first measurement point provided at a first section of the plant;
   a second measuring instrument which measures a second controlled variable related to a position of a second measurement point provided at a second section of the plant;
   a controlling section which obtains the control input from a first variable obtained by a control operation using a deviation between a measurement result of the first measuring instrument and a desired value and a second variable obtained by a control operation using a deviation between a measurement result of the second measuring instrument and the desired value, and gives the control input to a control point provided at the plant, wherein
   in a vibration component related to a resonance mode which appears when a section, from the control point to the first measurement point, of the plant is a rigid body, a first vibration component related to a resonance mode of the first section and a second vibration component related to a resonance mode of the second section are in a relation in opposite phase, and the first and second vibration components cancel out each other.

2. The driving system according to claim 1 wherein
the first controlled variable includes at least one type of a physical quantity related to a position of the first section, and
the second controlled variable includes at least one type of a physical quantity related to a position of the second section.

3. The driving system according to claim 1 wherein
the controlling section includes a first controller that obtains the first variable by performing a control operation using a deviation between the first controlled variable and the desired value and a second controller that obtains the second variable by performing a control operation using a deviation between the second controlled variable and the desired value, and an adder which calculates a sum of the first variable and the second variable, and gives the sum to the plant as the control input.

4. The driving system according to claim 3 wherein
the controlling section structures a closed loop control system together with the plant, to which the desired value is input, and the control input is obtained according to an operational expression expressed in a form of a Laplace transform $U(X_1, X_2)=C_1X+C_2X_2$, using Laplace transforms $X_1, X_2$ of the first controlled variable and the second controlled variable and transfer functions $C_1, C_2$ corresponding to the first controller and the second controller, respectively, and
the transfer functions $C_1, C_2$ are decided so that poles corresponding to the resonance mode included respectively in transfer functions $P_1, P_2$ corresponding to the first section and the second section are canceled out in a transfer function $C_1P_1+C_2P_2$.

5. The driving system according to claim 4 wherein
a specific form of the transfer functions $P_1, P_2$ is given, using a dynamic model which expresses a motion of the first section and the second section as a motion of two rigid bodies connected by a spring.

6. The driving system according to claim 5 wherein
the transfer functions $P_1, P_2$, using a Laplace transform $(U, X_1, X_2)$ of the control input, and the first controlled variable and the second controlled variable, are defined as $P_1=X_1/U, P_2=X_2/U$, and
various kinds of parameters included in the dynamic model are decided so that a specific form of the transfer functions $P_1, P_2$ reproduces frequency response characteristics of the transfer functions $P_1, P_2$ that are obtained by applying real measurement results of the first controlled variable and the second controlled variable with respect to the control input to the definitional equation $P_1=X_1U, P_2=X_2/U$.

7. The driving system according to claim 4 wherein
the transfer functions $P_1, P_2$ are expressed using functions $D_P, D_R$ that express characteristics of a rigid-body mode and the resonance mode, respectively, in fractional expressions $P_1=N_{P1}/(D_PD_R), P_2=N_{P2}/(D_PD_R)$,
the transfer functions $C_1, C_2$ are expressed in fractional expressions $C_1=N_{C1}/D_C, C_2=N_{C2}/D_C$, and
a denominator section $DC$ of the transfer functions $C_1, C_2$ is decided so that $D_CD_P+\alpha$ ($\alpha$ is an arbitrary analytical function) has an arbitrary stable pole.

8. The driving system according to claim 7 wherein
numerator sections $N_{C1}, N_{C2}$ of the transfer functions $C_1, C_2$, are decided as $N_{C1}=a\alpha, N_{C2}=b\alpha$, using the arbitrary analytical function $\alpha$ and constants a and b given only by a parameter related to the rigid-body mode so that a characteristic equation $A_{CL}=D_CD_PD_R+N_{C1}N_{P1}+N_{C2}N_{P2}$ of a transfer function of the closed loop control system satisfies $A_{CL}=(D_CD_P+\alpha)D_R$.

9. The driving system according to claim 1 wherein
the plant is driven in a translation direction, and
the first controlled variable includes at least one of a physical quantity related to a position in the translation direction of the first section, and the second controlled variable includes at least one of a physical quantity related to a position in the translation direction of the second section.

10. The driving system according to claim 1 wherein
the plant is driven in a rotation direction, and
the first controlled variable includes at least one of a physical quantity related to a position in the translation direction of the first section, and the second controlled variable includes at least one of a physical quantity related to a position in the rotation direction of the second section.

11. The driving system according to claim 1 wherein
the first section of the plant is driven in a translation direction and the second section of the plant is driven in a rotation direction, whereby
the first controlled variable includes at least one of a physical quantity related to a position in the translation direction of the first section, and
the second controlled variable includes at least one of a physical quantity related to a position in the rotation direction of the second section.

12. An exposure apparatus that exposes an object with an energy beam and forms a pattern on the object, the apparatus comprising:
the driving system according to claim 1 wherein the plant is a movable body that moves on a predetermined plane holding the object.

13. The exposure apparatus according to claim 12 wherein
the movable body has a first movable body that moves on the predetermined plane, and a second movable body that moves above the first movable body holding the object, and
the first section and the second section of the plant are included in the first movable body and the second movable body, respectively.

14. The exposure apparatus according to claim 12 wherein
the movable body has a first movable body that moves on a predetermined plane holding the object, and a second movable body that includes a screw section structuring a feed screw mechanism together with a nut section structuring a part of the first movable body, and
the first section and the second section of the plant are included in the first movable body and the second movable body, respectively.

15. An exposure apparatus that exposes an object via a mask with an energy beam, the apparatus comprising:
the driving system according to claim 1 wherein the plant is a movable body that moves holding the mask.

16. A driving method, comprising:
measuring a first controlled variable related to a position of a first section of a plant;
measuring a second controlled variable related to a position of a second section of the plant;

obtaining a first variable by performing a control operation using a deviation between a measurement result of the first controlled variable and a desired value;
obtaining a second variable by performing a control operation using a deviation between a measurement result of the second controlled variable and the desired value;
obtaining a control input from the first variable and the second variable, and driving the plant by giving the control input to a control point of the plant; and
prior to measuring the second controlled variable, setting a position of the second section so that in a vibration component related to a resonance mode which appears when a section, from the control point to the first measurement point, of the plant is a rigid body, a first vibration component related to a resonance mode of the first section and a second vibration component related to a resonance mode of the second section are in a relation in opposite phase and causing the first vibration component and the second vibration component to cancel out each other.

17. The driving method according to claim 16 wherein
the first controlled variable is at least one type of a physical quantity related to a position of the first section, and the second controlled variable is at least one type of a physical quantity related to a position of the second section.

18. The driving method according to claim 16 wherein in the driving, a sum of the first variable and the second variable is calculated and the sum is given to the plant as the control input, the first variable being obtained in a control operation using a deviation between the first controlled variable and the desired value and the second variable being obtained in a control operation using a deviation between the second controlled variable and the desired value.

19. The driving method according to claim 18 wherein
in the driving, the control input is obtained according to an operational expression expressed in a form of a Laplace transform $U(X_1, X_2) = C_1 X + C_2 X^2$, using Laplace transforms $X_1$, $X_2$ of the first controlled variable and the second controlled variable and transfer functions $C_1$, $C_2$ corresponding to a control operation for obtaining the first variable and the second variable, respectively, and
the transfer functions $C_1$, $C_2$ are decided so that poles corresponding to the resonance mode included respectively in transfer functions $P_1$, $P_2$ corresponding to the first section and the second section are canceled out in a transfer function $C_1 P_1 + C_2 P_2$.

20. The driving method according to claim 19 wherein
a specific form of the transfer functions $P_1$, $P_2$ is given, using a dynamic model which expresses a motion of the first section and the second section as a motion of two rigid bodies connected by a spring.

21. The driving method according to claim 20 wherein
the transfer functions $P_1$, $P_2$ are defined, using a Laplace transform $(U, X_1, X_2)$ of the control input, and the first controlled variable and the second controlled variable, as $P_1 = X_1/U$, $P_2 = X_2/U$, and
various kinds of parameters included in the dynamic model are decided so that a specific form of the transfer functions $P_1$, $P_2$ reproduces frequency response characteristics of the transfer functions $P_1$, $P_2$ that are obtained by applying real measurement results of the first controlled variable and the second controlled variable with respect to the control input to the definitional equation $P_1 = X_1/U$, $P_2 = X_2/U$.

22. The driving method according to claim 19 wherein
the transfer functions $P_1$, $P^2$ are expressed using functions $D_P$, $D_R$ that express characteristics of a rigid-body mode and the resonance mode, respectively, in fractional expressions $P_1 = N_{P1}/(D_P D_R)$, $P_2 = N_{P2}/(D_P D_R)$,
the transfer functions $C_1$, $C_2$ are expressed in fractional expressions $C_1 = N_{C1}/D_C$, $C_2 = N_{C2}/D_C$, and
the denominator section $D_C$ of the transfer functions $C_{C1}$, $C_2$ is decided so that $D_C D_P + \alpha$ ($\alpha$ is an arbitrary analytical function) has an arbitrary stable pole.

23. The driving method according to claim 22 wherein
numerator sections $N_{C1}$, $N_{C2}$ of the transfer functions $C_1$, $C_2$, are decided as $N_{C1} = a\alpha$, $N_{C2} = b\alpha$, using the arbitrary analytical function $\alpha$ and constants a and b given only by a parameter related to the rigid-body mode so that a characteristic equation $A_{CL} = D_C D_P D_R + N_{C1} N_{P1} + N_{C2} N^{P2}$ of a transfer function of the closed loop control system satisfies $A_{CL} = (D_C D_P + \alpha) D_R$.

24. The driving method according to claim 16 wherein in the measuring, at least one of a physical quantity related to a position in a translation direction of the first section is measured as the first controlled variable and at least one of a physical quantity related to a position in the translation direction of the second section is measured as the second controlled variable, and
in the driving, the plant is driven in the translation direction.

25. The driving method according to claim 16 wherein
in the measuring, at least one of a physical quantity related to a position in a rotation direction of the first section is measured as the first controlled variable and at least one of a physical quantity related to a position in the rotation direction of the second section is measured as the second controlled variable, and
in the driving, the plant is driven in the rotation direction.

26. The driving method according to claim 16 wherein
in the measuring, at least one of a physical quantity related to a position in a translation direction of the first section is measured as the first controlled variable, and at least one of a physical quantity related to a position in a rotation direction of the second section is measured as the second controlled variable, and
in the driving, the first section and the second section of the plant are driven in the translation direction and the rotation direction, respectively.

27. An exposure method in which an object is exposed with an energy beam, and a pattern is formed on the object, the method comprising:
driving a movable body that moves on a predetermined plane holding the object by the driving method according to claim 16 as the plant.

28. The exposure method according to claim 27 wherein
the movable body having a first movable body that moves on the predetermined plane and a second movable body that moves above the first movable body holding the object serves as the plant, and
a first controlled variable related to a position of the first movable body and a second controlled variable related to a position of the second movable body showing a resonance mode of an opposite phase to the first movable body with respect to a rigid-body mode are measured, when driving the movable body.

29. The exposure method according to claim 27 wherein
the movable body having a first movable body that moves on a predetermined plane holding the object, and a second movable body that includes a screw section structuring a feed screw mechanism together with a nut section structuring a part of the first movable body serves as the plant, and a first controlled variable related to a position of the first movable body and a second controlled variable related to a position of the second movable body that shows a resonance mode of an opposite phase to the first movable body with respect to a rigid-body mode are measured, when driving the movable body.

30. An exposure method in which an object is exposed via a mask with an energy beam, the method comprising:
    driving a movable body that moves holding the mask by the driving method according to claim 16 as the plant.

31. A driving system design method in which a driving system for driving a plant is designed, the method comprising:
    installing a first measuring instrument and a second measuring instrument that measure a first controlled variable and a second controlled variable related to positions of a first section and a second section of the plant, respectively, at the first section and the second section of the plant where vibration modes with respect to a rigid-body mode become an opposite phase mutually; and
    coupling a controlling section to the first measuring, instrument and the second measuring instrument, the controlling section giving a control input to a control point provided at the plant and causing a resonance mode of the first section and a resonance mode of the second section to cancel out each other, and the control input being obtained from a first variable obtained in a control operation using a deviation between a measurement result of the first measuring instrument and a first desired value and a second variable obtained in a control operation using a deviation between a measurement result of the second measuring instrument and a second desired value.

32. The driving system design method according to claim 31, further comprising:
    deciding the transfer functions $C_1$, $C_2$, so that poles corresponding to the resonance mode included respectively in transfer functions $P_1$, $P_2$, corresponding to the first section and the second section are canceled out in a transfer function $C_1P_1+C_2P_2$, by an operational expression to obtain a control input given to the plant given in a form of a Laplace transform $U(X_1, X_2)=C_1X_1+C^2X_2$, using Laplace transforms $X_1$, $X_2$ of the first controlled variable and the second controlled variable, and transfer functions $C_1$, $C_2$ that correspond to a control operation to obtain the first variable using a deviation between the first controlled variable and the first desired value, and a control operation to obtain the second variable using a deviation between the second controlled variable and the second desired value, respectively.

33. The driving system design method according to claim 32 wherein
    in the deciding, a specific form of the transfer functions $P_1$, $P_2$ is given, using a dynamic model that expresses a motion of the first section and the second section as a motion of two rigid bodies connected by a spring.

34. The driving system design method according to claim 33 wherein
    the transfer functions $P_1$, $P_2$ are defined, using a Laplace transform (U, $X_1$, $X_2$) of the control input and the first controlled variable and the second controlled variable, as $P_1=X_1/U$, $P^2=X_2/U$, and
    deciding various kinds of parameters included in the dynamic model so that a specific form of the transfer functions $P_1$, $P_2$ reproduces frequency response characteristics of the transfer functions $P_1$, $P^2$ that are obtained by applying real measurement results of the first controlled variable and the second controlled variable with respect to the control input to the definitional equation $P_1=X_1/U$, $P_2=X_2/U$.

35. The driving system design method according to claim 32 wherein
    the transfer functions $P_1$, $P_2$ are expressed using functions $D_P$, $D_R$ that express properties of the rigid-body mode and the resonance mode, respectively, in fractional expressions $P_1=N_{P1}/(D_PD_R)$, $P_2=N_{P2}/(D_PD_R)$,
    the transfer functions $C_1$, $C_2$ are expressed in fractional expressions $C_1=N_{C1}/D_C$, $C_2=N_{C2}/D_C$, and
    in the deciding, the denominator section $D_C$ of the transfer functions $C_1$, $C_2$ are decided so that $D_CD_P+\alpha$ ($\alpha$ is an arbitrary analytical function) has an arbitrary stable pole.

36. The driving system design method according to claim 35 wherein
    in the deciding, numerator sections $N_{C1}$, $N_{C2}$ of the transfer functions $C_1$, $C_2$ are decided, using the arbitrary analytical function $\alpha$ and constants a and b given only by a parameter related to the rigid-body mode, as $N_{C1}=a\alpha$, $N_{C2}=b\alpha$, so that characteristic equation $A_{CL}=D_CD_PD_R+N_{C1}N_{P1}+N_{C2}N_{P2}$ of a transfer function of the closed loop control system satisfies $A_{CL}=(D_CD_P+\alpha)D_R$.

* * * * *